(12) United States Patent
Saito

(10) Patent No.: US 8,018,755 B2
(45) Date of Patent: Sep. 13, 2011

(54) MEMORY DEVICE, SEMICONDUCTOR DEVICE, AND ELECTRONIC DEVICE

(75) Inventor: Toshihiko Saito, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 142 days.

(21) Appl. No.: 12/202,516

(22) Filed: Sep. 2, 2008

(65) Prior Publication Data

US 2009/0059650 A1  Mar. 5, 2009

(30) Foreign Application Priority Data

Sep. 3, 2007  (JP) .................................. 2007-227386

(51) Int. Cl.
*G11C 7/00* (2006.01)
*G11C 11/00* (2006.01)

(52) U.S. Cl. .................................. 365/148; 365/189.15
(58) Field of Classification Search .......................... None
See application file for complete search history.

(56) References Cited

U.S. PATENT DOCUMENTS

| | | | | |
|---|---|---|---|---|
| 3,833,894 A * | 9/1974 | Aviram et al. ................. | 365/151 |
| 4,763,183 A * | 8/1988 | Ng et al. ......................... | 257/288 |
| 5,242,851 A | 9/1993 | Choi | |
| 5,583,819 A | 12/1996 | Roesner et al. | |
| 6,534,841 B1 | 3/2003 | Van Brocklin et al. | |
| 6,654,275 B2 * | 11/2003 | Forbes ........................... | 365/154 |
| 6,720,866 B1 * | 4/2004 | Sorrells et al. ................ | 340/10.4 |
| 7,067,868 B2 * | 6/2006 | Thean et al. ................... | 257/296 |
| 2005/0263767 A1 * | 12/2005 | Yamazaki et al. ............... | 257/72 |
| 2006/0261331 A1 * | 11/2006 | Yukawa ........................... | 257/40 |
| 2006/0263634 A1 | 11/2006 | Yamazaki | |
| 2007/0105285 A1 | 5/2007 | Kusumoto et al. | |

FOREIGN PATENT DOCUMENTS

| | | |
|---|---|---|
| JP | 8-116109 | 5/1996 |
| JP | 2006-352104 | 12/2006 |
| WO | WO 2004/036482 A2 | 4/2004 |

\* cited by examiner

*Primary Examiner* — Hoai V Ho
*Assistant Examiner* — James G Norman
(74) *Attorney, Agent, or Firm* — Husch Blackwell LLP

(57) ABSTRACT

To provide a memory device which can maintain data accurately even when memory characteristics of a memory element deteriorate over time. The memory device includes a memory cell 100, a reading circuit 103, a power supply line 104, a first signal line 105, a second signal line 102, and an output terminal 106. The memory cell 100 includes a memory element 108, the resistance value of which is changed and holds data by utilizing the resistance value of the memory element 108. The reading circuit 103 reads data held in the memory cell 100. The output terminal 106 outputs a potential of the power supply line 104 or a potential corresponding to the data held in the memory cell 100 in accordance with the resistance value of the memory element 108. The reading circuit 103 includes a transistor 109 having first to fourth terminals. The threshold voltage of the transistor 109 is controlled by supplying a potential to a channel region through the fourth terminal.

21 Claims, 14 Drawing Sheets

MEMORY DEVICE, SEMICONDUCTOR DEVICE, AND ELECTRONIC DEVICE

BACKGROUND OF THE INVENTION

1. Field of the Invention

The present invention relates to a memory device. In addition, the present invention relates to a semiconductor device on which a memory device is mounted. Further, the present invention relates to an electronic device on which a semiconductor device is mounted.

2. Description of the Related Art

In recent years, most various electronic devices such as computers can perform desired operations by using a variety of data. When the data is held in, for example, a memory device (also referred to as a memory) or the like, the data can be used temporarily or permanently. A memory device also refers to an external memory device (an auxiliary memory device) such as a hard disk or a flexible disk in a broad sense. However, a memory device almost always refers to a semiconductor memory device such as a CPU (central processing unit). Two main types of memory devices are a volatile memory and a nonvolatile memory. A volatile memory refers to a memory device in which data is lost even after the data is held. In addition, a nonvolatile memory refers to a memory device in which data can be held semi-permanently after the data is held.

Although a volatile memory has a possibility of losing data, it has an advantage of short access time. In addition, although a nonvolatile memory can hold data, it has a disadvantage of high power consumption. Memory devices each have features in this manner, and each of the memory devices is used in accordance with the kind or usage of data.

Among the memory devices, there is a memory device (hereinafter referred to as a resistive random access memory device) which changes the resistance of a memory element, determines voltage before change in the resistance and voltage after the change in the resistance, and holds the voltage as data. An example of such a resistive random access memory device is, for example, an organic memory, which is a kind of the nonvolatile memory. An example of such an organic memory is, for example, a memory (hereinafter referred to as a short-circuited type organic memory) which includes a memory element in which at least a single layer which contains an organic compound (hereinafter referred to as an organic compound layer) is provided between a pair of electrodes, decreases the resistance value of the memory element by applying high voltage between the electrodes to fluoride the organic compound layer so that the pair of electrodes are short-circuited, distinguishes a written state and an unwritten state from each other with the existence and nonexistence of the short-circuit, and holds voltage in each state (for example, Reference 1: Japanese Published Patent Application No. 2006-352104).

SUMMARY OF THE INVENTION

However, in such a resistive random access memory device, there is a problem in that a phenomenon (hereinafter referred to as a data holding function deterioration phenomenon) occurs in which, when time passes after data is written by a writing operation, electric resistance (hereinafter referred to as resistance) of a memory element is gradually changed and the written data cannot be maintained at an accurate value. This data holding function deterioration phenomenon is described with reference to FIG. 14. FIG. 14 is a diagram showing change in resistance values of a memory element over time, where an organic memory is used for a memory element, for example. Note that in this specification, a resistance value (hereinafter referred to as threshold resistance) in a boundary between a range of resistance values which are determined as a written state and a range of resistance values which are determined as an unwritten state is denoted by Rth, a range of voltage which has a higher resistance value than the threshold resistance Rth is denoted by an unwritten-state range 704, and a range of voltage which has a lower resistance value than the threshold resistance Rth is denoted by a written-state range 705.

As illustrated in FIG. 14, the resistance value of the memory element is a resistance value 700 at a time $T_1$ after writing. Meanwhile, as time passes, the resistance value of the memory element rises from the resistance value 700 to a resistance value 701 at a time $T_2$, the resistance value of the memory element rises from the resistance value 701 to a resistance value 702 at a time $T_3$, and the resistance value of the memory element exceeds the threshold resistance Rth and rises to a resistance value 703, which is in the unwritten-state range 704.

Further, when the resistance of such a memory element rises to a certain value, the resistance does not rise any more and is in a floating state. Thus, in order to maintain written data, it is preferable that the threshold resistance Rth be a value between initial resistance $R_o$ before writing and maximum resistance $R_{max}$ after the resistance rises after writing.

In view of the foregoing problems, it is an object of the present invention to provide a highly reliable memory device which can maintain written data even when memory characteristics of a memory element deteriorate over time.

One aspect of the present invention is a memory device which includes a memory cell and a reading circuit. The memory cell includes a memory element, a resistance value of which is changed and holds data by utilizing the resistance value. The reading circuit reads the data held in the memory cell. The reading circuit changes the threshold voltage in accordance with change in the resistance value of the memory element because the reading circuit has a means for controlling the threshold voltage. Thus, data can be maintained at a normal value.

More specifically, one aspect of the present invention is a memory device which includes a memory cell, a reading circuit, a power supply line, a first signal line, a second signal line, and an output terminal. The memory cell includes a memory element, a resistance value of which is changed and holds data by utilizing the resistance value of the memory element. The reading circuit reads data held in the memory cell. The output terminal outputs a potential of the power supply line or a potential corresponding to the data held in the memory cell in accordance with the state of the resistance value of the memory element. The reading circuit includes a transistor. The transistor includes a first terminal, a second terminal, a third terminal, and a fourth terminal. The first terminal of the transistor is electrically connected to the power supply line and serves as one of a source terminal and a drain terminal. The second terminal of the transistor is electrically connected to the memory cell and the output terminal through the second signal line and serves as the other of the source terminal and the drain terminal. The third terminal of the transistor is electrically connected to the first signal line and serves as a gate terminal. The transistor is turned ON by supplying a first potential to a channel region through the third terminal and the threshold voltage of the transistor is controlled by supplying a second potential to the channel region through the fourth terminal.

Another aspect of the present invention is a memory device which includes a memory cell, a reading circuit, a power supply line, a first signal line, a second signal line, and an output terminal. The memory cell includes a memory element, a resistance value of which is changed and holds data by utilizing the resistance value of the memory element. The reading circuit reads data held in the memory cell. The output terminal outputs a potential of the power supply line or a potential corresponding to the data held in the memory cell in accordance with the resistance value of the memory element. The reading circuit includes a transistor. The transistor includes a first gate electrode, a first gate insulating film provided so as to cover the gate electrode, a semiconductor layer, a second gate insulating film provided so as to cover the semiconductor layer, and a second gate electrode provided over the second gate insulating film. The semiconductor layer is provided over the first gate insulating film and includes a source region, a drain region, and a channel region which is provided between the source region and the drain region. The transistor is turned ON by supplying a first potential to the chancel region through one of the first gate electrode and the second gate electrode and the threshold voltage of the transistor is controlled by supplying a second potential to the channel region through the other of the first gate electrode and the second gate electrode.

Another aspect of the present invention is a memory device which includes a memory cell, a reading circuit, a power supply line, a first signal line, a second signal line, and an output terminal. The memory cell includes a memory element, a resistance value of which is changed and holds data by utilizing the resistance value of the memory element. The reading circuit reads data held in the memory cell. The output terminal outputs a potential of the power supply line or a potential corresponding to the data held in the memory cell in accordance with the resistance value of the memory element. The reading circuit includes a transistor. The transistor includes a semiconductor substrate, a gate insulating film, and a gate electrode. The semiconductor substrate includes a first impurity region which serves as one of a source region and a drain region, a second impurity region which serves as the other of the source region and the drain region, a channel region which is provided between the first impurity region and the second impurity region, and a third impurity region. The gate insulating film is provided over the channel region. The gate electrode is provided over the gate insulating film. The transistor is turned On by supplying a first potential to the channel region through the gate electrode and the threshold voltage of the transistor is controlled by supplying a second potential to the channel region through the third impurity region.

In addition, the memory element can include a first electrode, a second electrode, and an organic compound layer which is provided between the first electrode and the second electrode.

Another aspect of the present invention is a semiconductor device which includes any of the above-described memory devices, an antenna, a high frequency circuit, and a logic circuit. The antenna transmits and receives data. The high frequency circuit generates power supply voltage by using a signal which is received from the antenna. The logic circuit is supplied with the power supply voltage and performs arithmetic calculation.

Another aspect of the present invention is an electronic device which includes the above-described semiconductor device.

Note that a gate terminal (also referred to as a third terminal) of a transistor in this document refers to part of a gate electrode (including a region, a conductive film, a wiring, or the like which serves as a gate) or part of a portion which is electrically connected to a gate electrode. Further, a source terminal refers to part of a source electrode (including a region, a conductive film, a wiring, or the like which serves as a source) or part of a portion which is electrically connected to a source electrode. Furthermore, a drain terminal refers to part of a drain electrode (including a region, a conductive film, a wiring, or the like which serves as a drain) or part of a portion which is electrically connected to a drain electrode.

Further, since a source terminal and a drain terminal change depending on the structure, the operating condition, and the like of a transistor, it is difficult to define which is a source terminal or a drain terminal. Therefore, in this document, one of a region which functions as a source terminal and a region which functions as a drain terminal is referred to as a first terminal and the other thereof is referred to as a second terminal.

According to the present invention, a memory device which can maintain a written value accurately and can read the written value even when memory characteristics of a memory element deteriorate over time can be provided.

DETAILED DESCRIPTION OF THE INVENTION

Hereinafter, embodiment modes and an example of the present invention will be described with reference to the drawings. Note that the present invention is not limited to the following description. The present invention can be implemented in various different ways and it will be readily appreciated by those skilled in the art that various changes and modifications are possible without departing from the spirit and the scope of the present invention. Therefore, the present invention should not be construed as being limited to the following description of the embodiment modes and example.

Embodiment Mode 1

In this embodiment mode, a memory device of the present invention is described.

Figure 1:
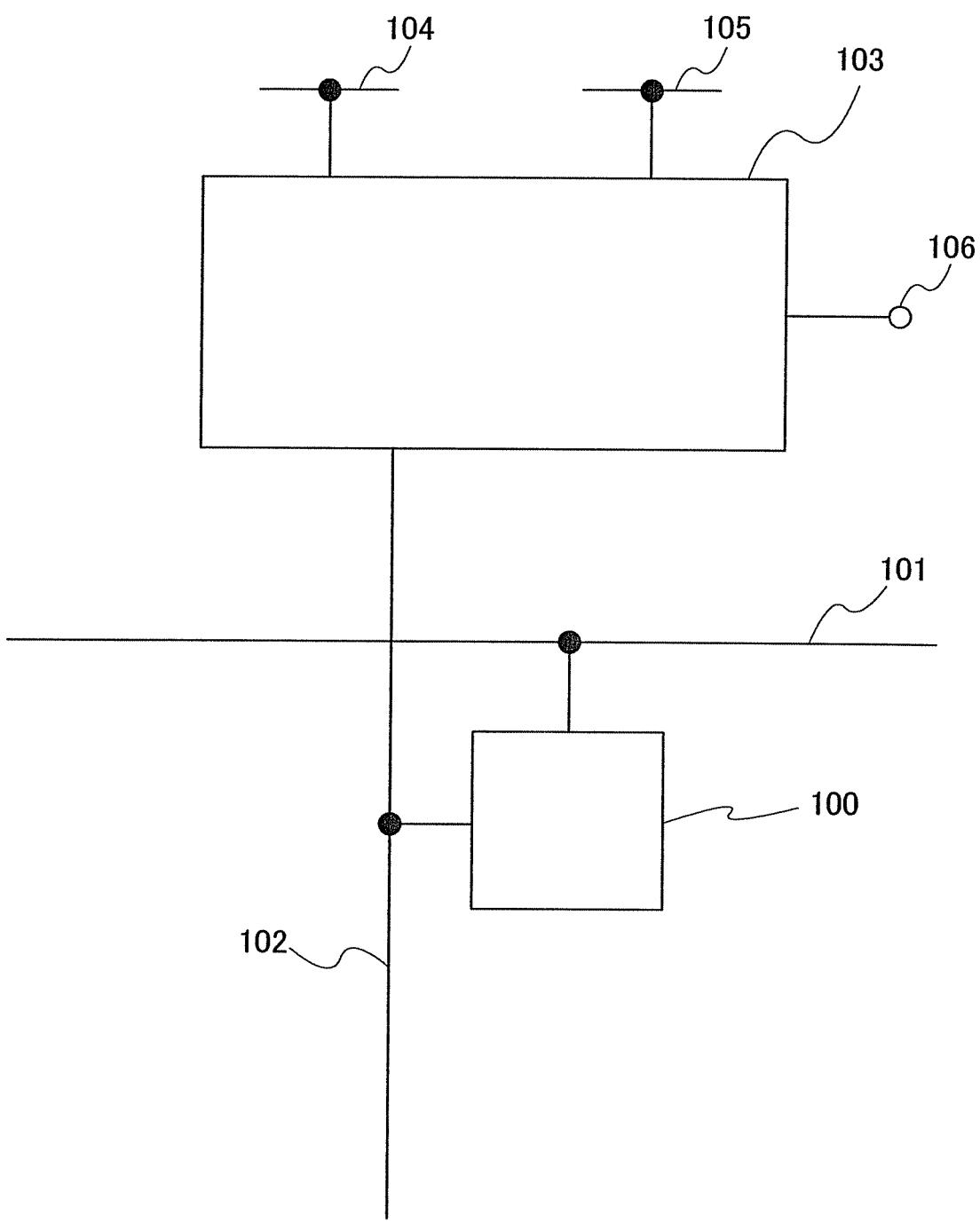
FIG. 1 is a block diagram illustrating a structure of a memory device of the present invention in Embodiment Mode 1.

First, the structure of a memory device of this embodiment mode is described with reference to FIG. 1. FIG. 1 is a block diagram showing the structure of the memory device of this embodiment mode.

As illustrated in FIG. 1, the memory device of this embodiment mode includes a memory cell 100, a word line 101 and a second signal line (also referred to as a bit line) 102 which are electrically connected to the memory cell 100, a reading circuit 103 which is electrically connected to the word line 101 and the second signal line 102, a power supply line 104 which is electrically connected to the reading circuit 103, a first signal line (also referred to as an address signal line) 105, and an output terminal 106.

The memory cell 100 has a function of storing data in accordance with a signal from the outside. In addition, the reading circuit 103 has a function of reading data stored in the selected memory cell 100 and outputting the data from the output terminal 106. The word line 101 and the second signal line 102 each have a function of supplying a signal to the memory cell 100 in accordance with a signal from the outside.

Figure 2:
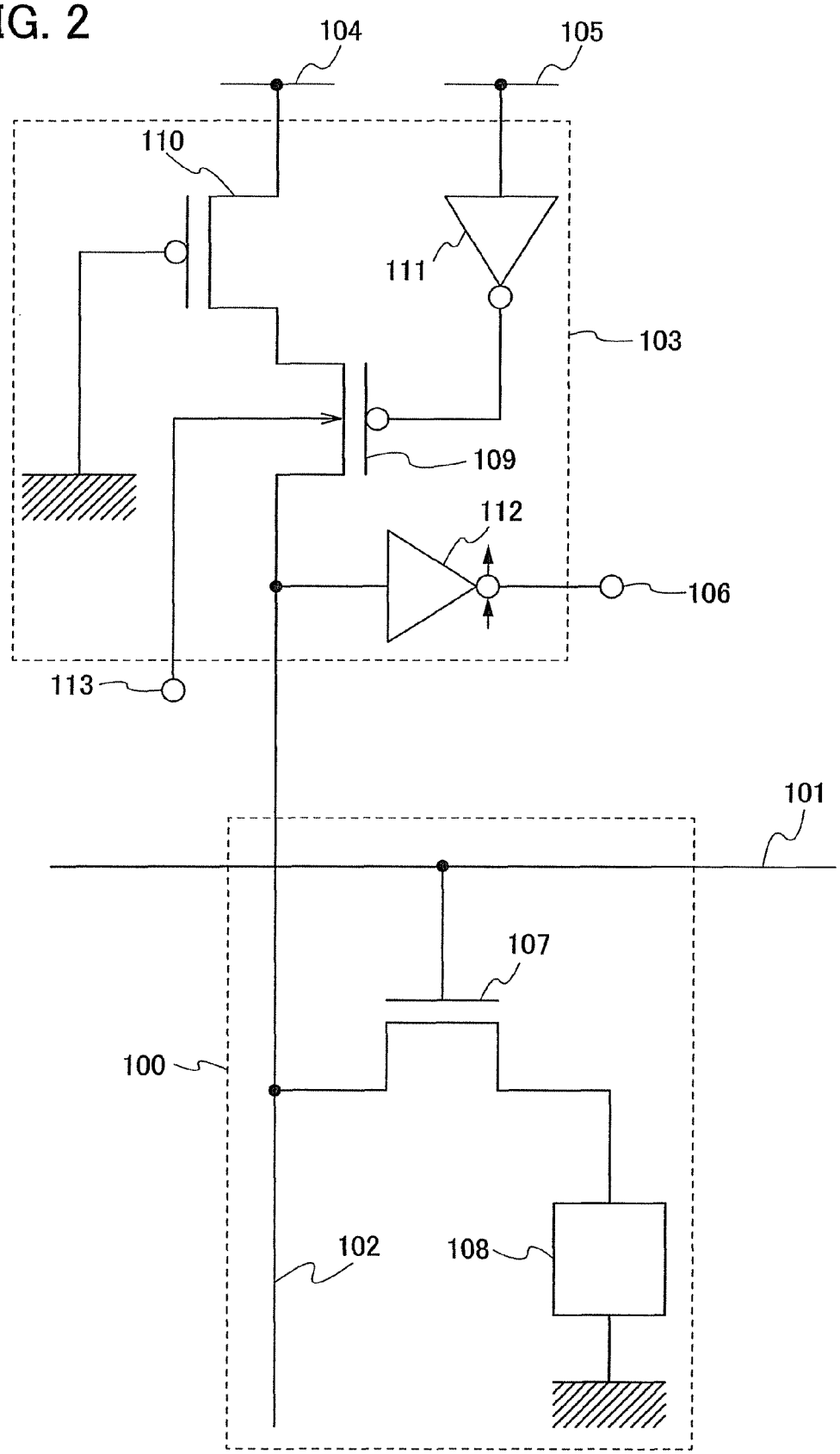
FIG. 2 is a circuit diagram illustrating a structure of the memory device of the present invention in Embodiment Mode 1.

Further, a more specific structural example of the memory cell 100 and the reading circuit 103 is described with reference to FIG. 2. FIG. 2 is a circuit diagram illustrating a structural example of the memory device of this embodiment mode.

The memory device of this embodiment mode includes the memory cell 100, the word line 101 and the second signal line 102 which are electrically connected to the memory cell 100, the reading circuit 103 which is electrically connected to the word line 101 and the second signal line 102, the power supply line 104 which is electrically connected to the reading circuit 103, and the first signal line 105.

The memory cell 100 includes a first transistor 107 and a memory element 108. A gate terminal of the first transistor 107 is electrically connected to the word line 101, and a first terminal of the first transistor 107 is electrically connected to the second signal line 102. The memory element 108 is electrically connected to a second terminal of the first transistor 107.

The first transistor 107 is turned on in accordance with a signal from the word line 101 and has a function of outputting a signal from the second signal line 102 to the memory element 108.

The memory element 108 has a function of holding voltage in a changed resistance value as data when the resistance value of the memory element 108 is changed in accordance with a signal which is input from the outside. As the memory element 108, any memory element can be used as long as it holds data in accordance with change in electric resistance in the element, characteristics such as resistance values are changed by change over time, and a data holding function deteriorates. For example, a memory element which includes a first electrode, a second electrode, and an organic compound layer provided between the first electrode and the second electrode (hereinafter referred to as an organic memory); a memory element which includes a first electrode, a second electrode, and a semiconductor layer of amorphous silicon or the like, which is provided between the first electrode and the second electrode; a PRAM (phase change random access memory); or the like can be used as the memory element 108.

The reading circuit 103 includes a second transistor 109, a third transistor 110, an inverter 111, and a clocked inverter 112.

The second transistor 109 includes a first terminal, a second terminal, a third terminal, and a fourth terminal. The first terminal of the second transistor 109 is electrically connected to the power supply line 104 through the third transistor 110 and serves as one of a source terminal and a drain terminal. The second terminal of the second transistor 109 is electrically connected to the memory cell 100 through the second signal line 102, is electrically connected to the output terminal 106 through the second signal line 102 and the clocked inverter 112, and serves as the other of the source terminal and the drain terminal. The third terminal of the second transistor 109 is electrically connected to the first signal line 105 through the inverter 111 and serves as a gate terminal.

The third transistor 110 includes a first terminal, a second terminal, and a third terminal. The first terminal of the third transistor 110 is electrically connected to the power supply line 104 and serves as one of a source terminal and a drain terminal. The second terminal of the third transistor 110 is electrically connected to the first terminal of the second transistor 109 and serves as the other of the source terminal and the drain terminal. The third terminal of the third transistor 110 is grounded and serves as a gate terminal.

The inverter 111 includes an input terminal which is electrically connected to the first signal line 105 and an output terminal which is electrically connected to the third terminal of the second transistor 109.

The clocked inverter 112 includes an input terminal which is electrically connected to the second terminal of the second transistor 109 and an output terminal which is electrically connected to the output terminal 106.

The second transistor 109 is turned on in accordance with a signal which is input to the gate terminal from the first signal line 105 through the inverter 111. Thus, when the threshold voltage of the second transistor 109 is controlled, the reading operation of the memory cell 100 is controlled. In addition, the third transistor 110 has a function of adjusting the resistance values of the reading circuit 103 and the memory cell 100 in order to read data with a desired value and a desired resistance value when data stored in the memory cell 100 is read. Even in the case of using a resistor instead of the third transistor 110, an operation which is similar to that of the third transistor 110 can be realized. Further, when the resistance value of the second transistor 109 is lower than that of the third transistor 110, the second transistor 109 can be operated at higher speed.

As the second transistor 109, a transistor capable of controlling the threshold voltage can be used. For example, when a transistor which has four terminals is used as the second transistor 109, the second transistor 109 is turned ON by supplying a first potential to a channel region from the first signal line 105 through the inverter 111 and the third terminal, and the threshold voltage can be controlled by supplying a second potential to the channel region from an external terminal 113 through the fourth terminal. Further, in a manner similar to that of the second transistor 109, a transistor capable of controlling the threshold voltage can be used as the third transistor 110. When a transistor capable of controlling the threshold voltage is also used as the third transistor 110, data written to the memory element 108 can be maintained more surely.

Output from the memory cell 100 or output from the power supply line 104 is input to the clocked inverter 112 in accordance with the resistance value of the memory element 108 in the memory cell 100, and the clocked inverter 112 has a function of inverting polarity of an output potential which is input and outputs the inverted potential outside. Note that an address signal is input to a first clock signal input terminal and a second clock signal input terminal in the clocked inverter 112. A first clock signal is input to the first clock signal input terminal. A second clock signal which has polarity opposite to that of the first clock signal is input to the second clock signal input terminal.

Next, operations of the memory device in this embodiment mode are described.

First, a writing operation is described. The writing operation is performed by changing the resistance of the memory element. Here, for example, a state before the resistance of the memory element is changed (an unwritten state) is described as data of "0" a state after the resistance of the memory element is changed (a written state) is described as data of "1".

In the case of writing data of "1", the memory cell 100 which performs writing is selected; a signal is input to the selected memory cell 100 from the word line 101 and the second signal line 102; the first transistor 107 is turned on; a power supply potential is input to the memory element 108; and the memory element 108 is set in a written state by change in resistance of the memory element 108.

Next, a data holding operation after writing is described.

After writing data, taking rise in resistance of the memory element 108 due to change over time into consideration, the threshold voltage is decreased by a potential to the channel region from the fourth terminal of the second transistor 109 in the reading circuit 103 so that the threshold voltage is adjusted. At this time, the threshold voltage $V_{th}$ is preferably in a range where the stored data is output accurately. In the case where the threshold resistance is denoted by $R_{th}$, the maximum value of the resistance which is raised by the change over time is denoted by $R_{max}$, and an initial resistance value in an unwritten state is denoted by $R_0$ in the memory element 108, it is preferable that the threshold voltage $V_{th}$ of the second transistor 109 is set so as to satisfy $R_{max}<R_{th}<R_0$ to adjust reading capability of the reading circuit 103. Note that the threshold voltage $V_{th}$ can also be adjusted by using any of the following methods: a method for setting the threshold voltage $V_{th}$ taking rise in resistance of the memory element 108 due to change over time into consideration, a method for changing the threshold voltage $V_{th}$ in accordance with rise in resistance of the memory element 108 due to change over time by separately using a monitor circuit or the like, and the like.

Next, a reading operation is described.

In the case of performing the reading operation, the memory cell 100 which performs reading is selected first. Specifically, an address signal is output from the first signal line 105 to the reading circuit 103. The address signal which is input to the reading circuit 103 is inverted by the inverter 111 and is output to the gate terminal of the second transistor 109. The second transistor 109 to which the address signal is input is turned on. In the memory cell 100 which is selected by the reading circuit 103, the first transistor 107 is turned on by a signal from the word line 101. That is, the input terminal of the clocked inverter 112 is electrically connected to a power supply potential VDD and the memory element 108. Here, in the case where the memory element 108 is in an unwritten state, the power supply potential VDD is input to the clocked inverter 112 because the resistance value of the memory element 108 is high. In the case where the memory element 108 is in a written state, a potential corresponding to the held data is input to the clocked inverter 112 because the resistance value of the memory element 108 is low. The potential which is input to the clocked inverter 112 is inverted and is output from the output terminal 106.

Alternatively, a transistor having first to three terminals can be used as the second transistor 109, and a transistor where first to fourth terminals are provided and the threshold voltage can be controlled can be used as the third transistor 110. In this case, the gate terminal of the third transistor 110 is grounded and is always on. However, the value of on resistance is changed in accordance with change in the threshold voltage by supplying a potential to the channel region through the fourth terminal. Here, the value of on resistance of the third transistor 110 may be set so as to satisfy $R_{max}<R_{th}<R_0$ to adjust reading capability of the reading circuit 103.

As described above, even when the resistance value of a memory element changes over time, written data can be read while the written data is maintained in an accurate state.

Figure 3:
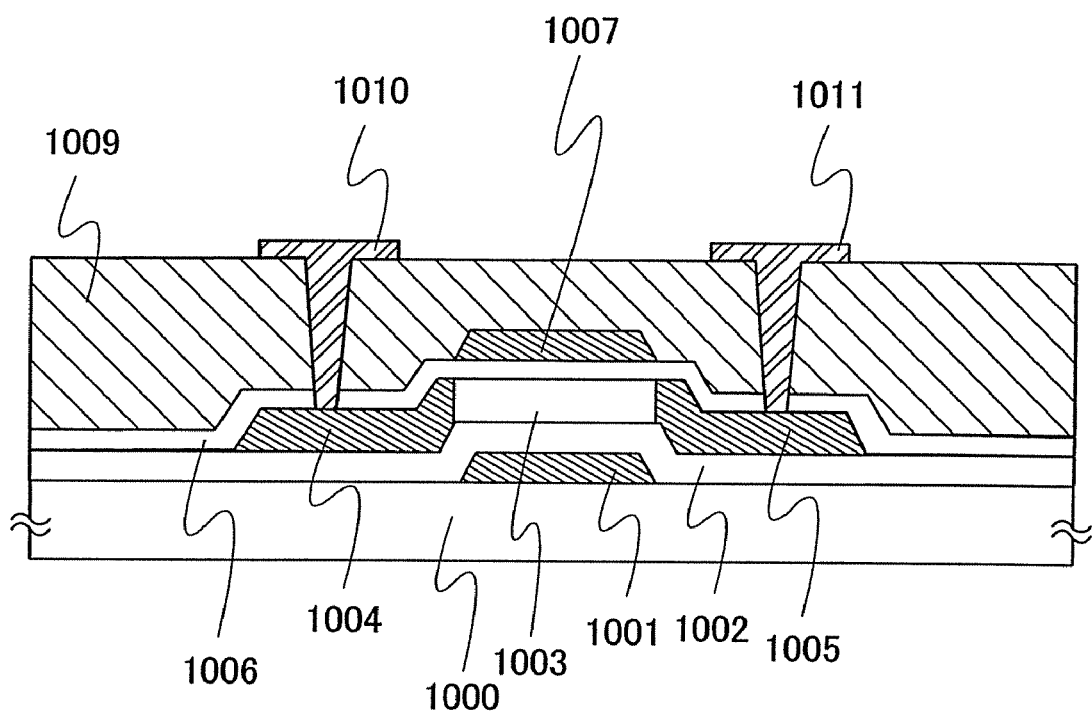
FIG. 3 is a cross-sectional view illustrating a structural example of a transistor which can be applied to the memory device of the present invention in Embodiment Mode 1.

Here, a transistor which can be used as each of the second transistor 109 and the third transistor 110 is described with reference to FIG. 3. FIG. 3 is a diagram schematically illustrating a cross section of a transistor.

The transistor in FIG. 3 includes a substrate 1000, a first gate electrode 1001 provided over the substrate 1000, a first gate insulating film 1002 provided over the first gate electrode 1001, a semiconductor layer 1003 provided over the first gate insulating film 1002, a second gate insulating film 1006 provided over the semiconductor layer 1003, and a second gate electrode 1007 provided over the second gate insulating film 1006. Further, the semiconductor layer 1003 includes a first impurity region 1004 and a second impurity region 1005. A channel region is formed between the first impurity region 1004 and the second impurity region 1005. An insulating layer 1009 is provided over the second gate electrode 1007. An optional number of contact portions are provided in part of the insulating layer 1009. A first wiring 1010 which is provided over the first impurity region 1004 and a second wiring 1011 which is provided over the second impurity region 1005 through the contact portion are provided through the contact portions.

As the substrate 1000, a glass substrate, a quartz substrate, a ceramic substrate, a metal substrate (e.g., a stainless steel substrate), or the like can be used, for example. Alternatively, a substrate formed using polyethylene terephthalate (PET), polyethylene naphthalate (PEN), polyether sulfone (PES), acrylic, or the like can be selected as a plastic substrate.

In addition, as each of the first gate insulating film 1002, the second gate insulating film 1006, and the insulating layer 1009, one or a plurality of silicon oxide, silicon nitride, silicon oxynitride, or silicon nitride oxide can be used. Further, each of the first gate insulating film 1002, the second gate insulating film 1006, and the insulating layer 1009 can have a stacked-layer structure by using the material/materials selected. The insulating layer can be formed by CVD, sputtering, or the like.

Further, as the semiconductor layer 1003, a single-layer structure or a stacked-layer structure of amorphous silicon, polycrystalline silicon, microcrystalline (also referred to as microcrystal or semi-amorphous) silicon, or the like can be used. The semiconductor layer 1003 can be formed by sputtering, LPCVD, plasma CVD, or the like.

Further, the semiconductor layer 1003 can be crystallized by being irradiated with a laser beam. Note that the semiconductor layer 1003 may be crystallized by a method in which laser beam irradiation is combined with thermal crystallization using RTA or an annealing furnace, or thermal crystallization using a metal element which promotes crystallization. After that, an obtained crystalline semiconductor film is etched into a desired shape to form the semiconductor layer 1003.

Each of the first gate electrode 1001 and the second gate electrode 1007 can be formed using an element selected from tantalum, tungsten, titanium, molybdenum, aluminum, copper, chromium, niobium, or the like, or an alloy material or compound material which contains any of these elements as its main component. Alternatively, each of the first gate electrode 1001 and the second gate electrode 1007 can be formed using a semiconductor material such as polycrystalline silicon to which an impurity element such as phosphorus is added. Further, a stacked-layer structure of one or a plurality of the above-described materials can be used. Examples of a combination of these materials are a tantalum nitride film and a tungsten film, a tungsten nitride film and a tungsten film, a molybdenum nitride film and a molybdenum film, and the like. Since tungsten and tantalum nitride have high heat resistance, heat treatment for thermal activation can be performed after a first layer and a second layer of the gate electrode are formed. Alternatively, each of the first gate electrode 1001 and the second gate electrode 1007 can have a structure of three or more layers instead of a two-layer structure. For example, in the case of a three-layer structure, a stacked-layer structure of a molybdenum film, an aluminum film, and a molybdenum film is preferably used.

Each of the first impurity region 1004 and the second impurity region 1005 can be formed by adding an impurity element to part of the semiconductor layer 1003. Further, when an impurity element is to be added to a predetermined region, a resist is separately formed and an impurity element is added by using the resist as a mask, so that each of the first impurity region 1004 and the second impurity region 1005 which contains a desired element in a desired region can be formed. Note that phosphorus or boron can be used as an impurity element.

As the insulating layer 1009, one kind or plural kinds of materials selected from an inorganic material such as silicon oxide or silicon nitride, an organic material such as polyimide, polyamide, benzocyclobutene, acrylic, or epoxy, or a siloxane material can be used. Further, a stacked-layer structure of one kind or plural kinds of the above-described materials can be used.

The first wiring 1010 and the second wiring 1011 function as a source wiring and a drain wiring. Each of the first wiring 1010 and the second wiring 1011 can be formed from an element selected from aluminum, tungsten, titanium, tantalum, molybdenum, nickel, platinum, copper, gold, silver, manganese, neodymium, carbon, or silicon, or an alloy material or compound material which contains any of these elements as its main component. Further, a stacked-layer structure of one kind or plural kinds of the above-described materials can be used. As an alloy material containing aluminum as its main component, for example, a material which contains aluminum as its main component and also contains nickel, or an alloy material which contains aluminum as its main component and also contains nickel and one or both of carbon and silicon, or the like can be used. As each of the first wiring 1010 and the second wiring 1011, a stacked-layer structure of a barrier film, an aluminum silicon (Al—Si) film, and a barrier film, or a stacked-layer structure of a barrier film, an aluminum silicon (Al—Si) film, a titanium nitride film, and a barrier film may be used, for example. Note that a barrier film corresponds to a thin film formed using titanium, titanium nitride, molybdenum, or molybdenum nitride. Since aluminum and aluminum silicon have low resistance values and are inexpensive, aluminum and aluminum silicon are suitable for materials for forming the first wiring 1010 and the second wiring 1011. In addition, when barrier layers are provided as an upper layer and a lower layer, generation of hillocks in aluminum or aluminum silicon can be prevented. Further, when a barrier film is formed using titanium, which is an element having high reducing properties, even when a thin natural oxide film is formed over a crystalline semiconductor film, the natural oxide film can be chemically reduced and a favorable contact with the crystalline semiconductor film can be obtained.

The first impurity region 1004 and the first wiring 1010, and the second impurity region 1005 and the second wiring 1011 function as a source terminal and a drain terminal. The channel region is formed between the first impurity region 1004 and the second impurity region 1005.

The first gate electrode 1001 or the second gate electrode 1007 functions as a fourth terminal of the transistor. When an optional potential from the outside is supplied to the channel region through one of the first gate electrode 1001 and the second gate electrode 1007, the threshold voltage of the transistor can be controlled.

Figure 4:
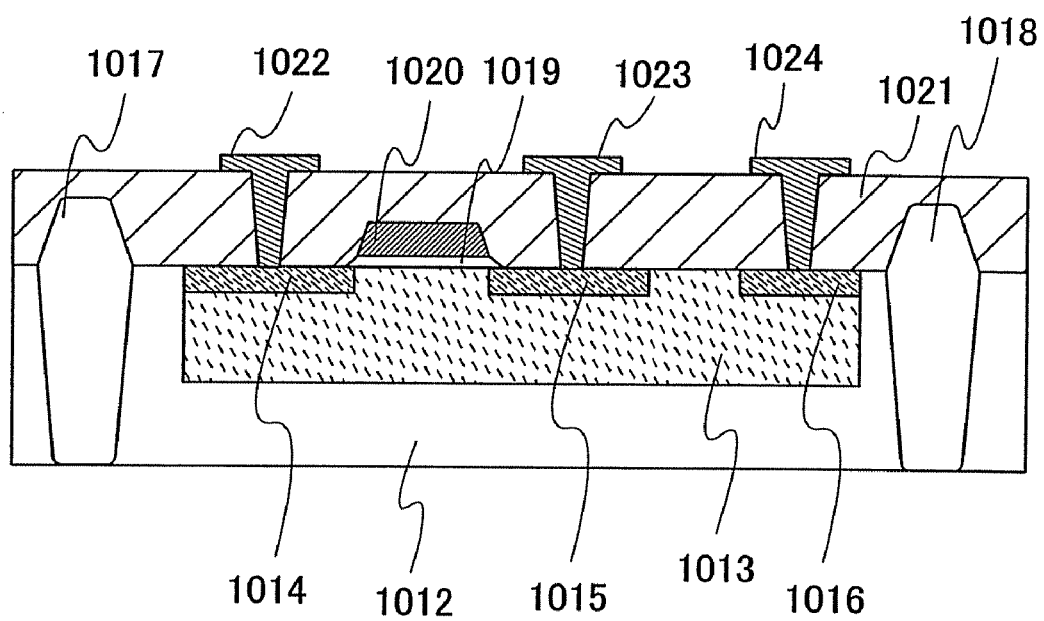
FIG. 4 is a cross-sectional view illustrating a structural example of a transistor which can be applied to the memory device of the present invention in Embodiment Mode 1.

Further, as another example of a transistor which can be used as a transistor which has a fourth terminal in this embodiment mode, a transistor which has a single-crystal semiconductor film is described with reference to FIG. 4. FIG. 4 is a diagram schematically illustrating a cross section of a transistor.

The transistor in FIG. 4 includes a substrate 1012 which has a first insulating layer 1017 and a second insulating layer 1018, a gate insulating film 1019 which is provided over the substrate 1012, and a gate electrode 1020 which is provided over the gate insulating film 1019. Further, the substrate 1012 includes a well region 1013 in its part. The well region 1013 includes a first impurity region 1014, a second impurity region 1015, and a third impurity region 1016 in its part. The gate insulating film 1019 and the gate electrode 1020 are provided between the first impurity region 1014 and the second impurity region 1015 in the substrate 1012. An insulating layer 1021 is provided over the gate electrode 1020 and the substrate 1012. An optional number of contact portions are provided in part of the insulating layer 1021. A first wiring 1022 which is provided over the first impurity region 1014, a second wiring 1023 which is provided over the second impurity region 1015, and a third wiring 1024 which is provided over the third impurity region 1016 are provided through the contact portions.

As the substrate 1012, for example, any of the following substrates can be used: a single-crystal silicon substrate which has n-type or p-type conductivity, a compound semiconductor substrate (e.g., a GaAs substrate, an InP substrate, a GaN substrate, a SiC substrate, a sapphire substrate, or a ZnSe substrate), and an SOI (silicon on insulator) substrate which is manufactured using a bonding method or a SIMOX (separation by implanted oxygen) method. Alternatively, a glass substrate to which single-crystal silicon is attached can be used.

The first insulating layer 1017 and the second insulating layer 1018 can be formed by a selective oxidation method (a LOCOS (local oxidation of silicon) method), a trench isolation method, or the like.

As the gate electrode 1020, tantalum, tungsten, titanium, molybdenum, aluminum, copper, chromium, niobium, or the like can be used. Alternatively, as well as a film formed of any of the above-described metals, the gate electrode 1020 can be formed using a film formed of an alloy which contains any of the above-described metals as its main component or a film formed using a compound which contains any of the above-described metals. Further alternatively, the gate electrode 1020 can be formed using a semiconductor such as polycrystalline silicon to which an impurity element which imparts conductivity to a semiconductor film, such as phosphorus, is added. Further, the gate electrode 1020 can be formed by being processed (e.g., patterned) into a predetermined shape.

Each of the well region 1013, the first impurity region 1014, the second impurity region 1015, and the third impurity region 1016 can be formed by adding an impurity element. As an impurity element, an impurity element which imparts n-type conductivity or an impurity element which imparts p-type conductivity is used. As an impurity element which imparts n-type conductivity, phosphorus, arsenic, or the like can be used. As an impurity element which imparts p-type conductivity, boron, aluminum, gallium, or the like can be used. Further, when an impurity element is to be added to a predetermined region, a resist is separately formed and an impurity element is added by using the resist as a mask, so that the well region 1013, the first impurity region 1014, the second impurity region 1015, and the third impurity region 1016 which contain a desired element in a desired region can be formed.

The gate insulating film 1019 can be formed using an inorganic material, an organic material, or a mixed material of an organic material and an inorganic material. For example, the gate insulating film 1019 can be formed using silicon oxide, silicon oxynitride, silicon nitride oxide, a film including carbon, which is typified by DLC (diamond like carbon), acrylic, epoxy, polyimide, polyamide, polyvinyl phenol, benzocyclobutene, or the like. Further, each of the first insulating layer 1017 and the second insulating layer 1018 can be formed by CVD, sputtering, a droplet discharge method, a printing method, or the like depending on a material thereof.

The first impurity region 1014 and the first wiring 1022, and the second impurity region 1015 and the second wiring 1023 function as a source terminal and a drain terminal. A channel region is formed between the first impurity region 1014 and the second impurity region 1015.

The third impurity region 1016 and the third wiring 1024, which serve as a body region, function as a fourth terminal of the transistor. Thus, when an optional potential is supplied to the channel region through the fourth terminal, the threshold voltage of the transistor can be controlled.

Note that the polarity of the second transistor 109 and the third transistor 110 in FIG. 2 is not particularly limited to a certain type. A p-channel transistor or an n-channel transistor can be used as appropriate as long as it can realize the operations of this embodiment mode. Further, depending on the value of an address signal which is input from the first signal line, the operations of this embodiment mode can be realized even when the inverter 111 is removed.

When a transistor where the threshold voltage can be controlled is used as the second transistor 109 in the reading circuit 103 in FIG. 2 as described above, the threshold voltage can be set to a desired value. Therefore, written data can be maintained at a normal value even when memory characteristics of the memory element deteriorate over time.

Further, since the threshold voltage is controlled by using a transistor where the threshold voltage can be controlled as the transistor in the reading circuit 103, a highly reliable memory device can be provided without using a method for controlling the threshold voltage by changing the gate length or the like to increase the circuit area, for example.

Embodiment Mode 2

In this embodiment mode, a more specific structure of a memory device of the present invention is described.

Figure 5:
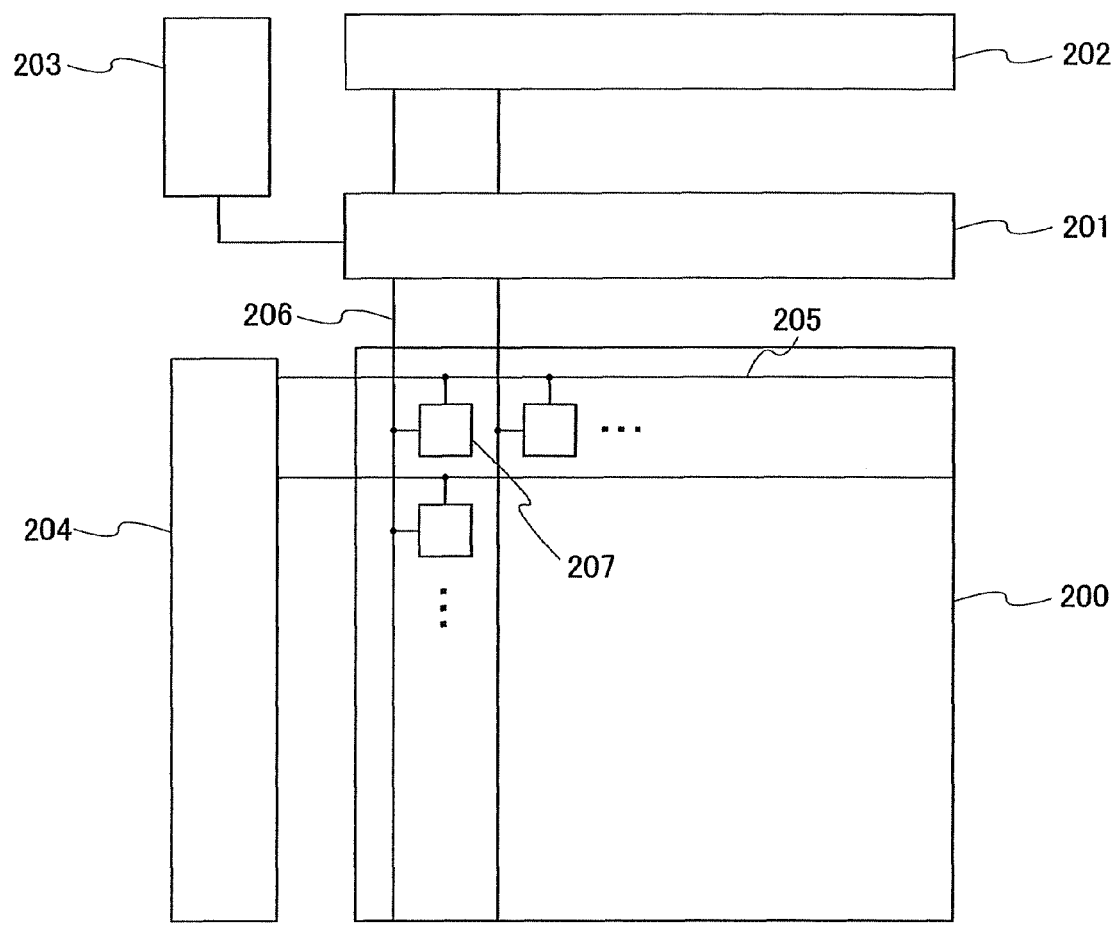
FIG. 5 is a block diagram illustrating a structure of a memory device of the present invention in Embodiment Mode 2.

The structure of a memory device of this embodiment mode is described with reference to FIG. 5. FIG. 5 is a block diagram illustrating the structure of the memory device of this embodiment mode.

As illustrated in FIG. 5, the memory device in this embodiment mode includes a memory cell array 200 where a plurality of memory cells 207 are arranged in matrix, a reading/writing circuit 201, a column decoder 202, a selector circuit 203, and a row decoder 204. Note that the structure of the memory device, which is illustrated here, is just an example, and the memory device can include a different circuit such as a sense amplifier, an output circuit, or a buffer.

The reading/writing circuit 201 includes different circuits, and circuit selection is performed by the selector circuit 203 when reading or writing is performed.

Each of the plurality of memory cells 207 is connected to a word line 205 which is connected to the row decoder 204 and a second signal line 206 which is connected to the column decoder 202.

Note that for the circuit structure of the memory cell 207 and the reading/writing circuit 201, the structure and elements described in Embodiment Mode 1 can be used.

Figure 6:
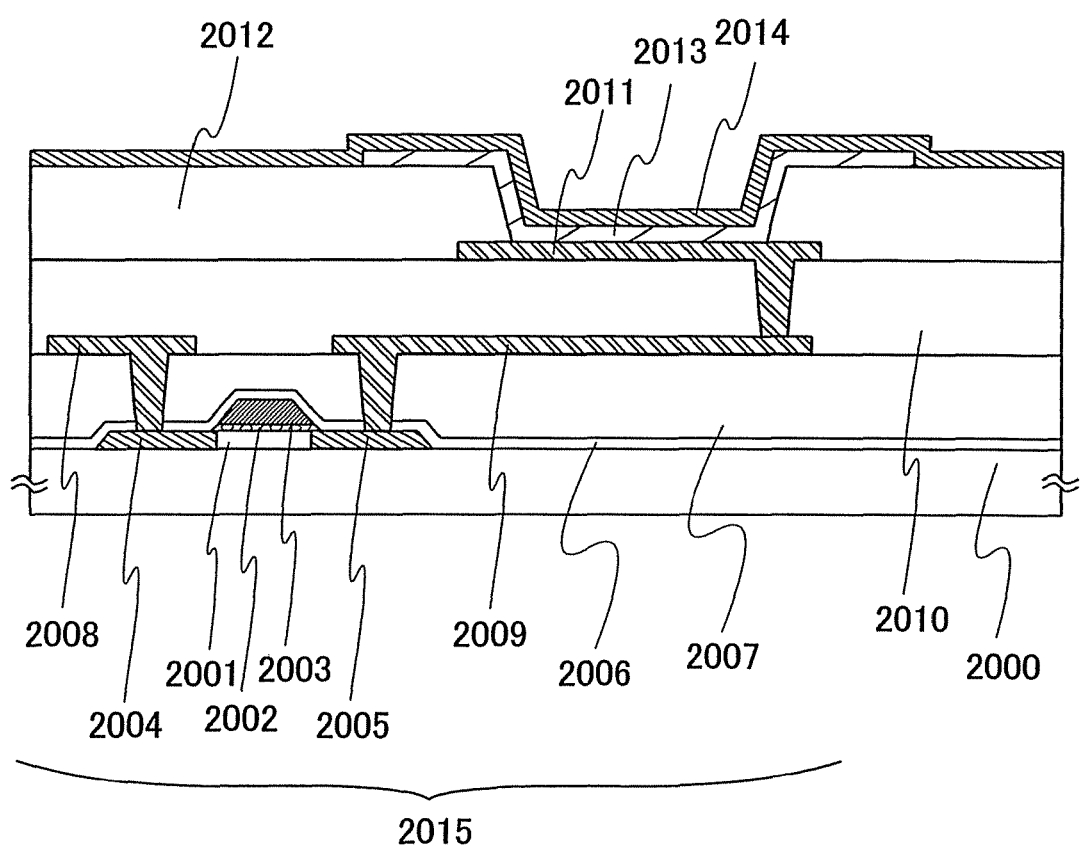
FIG. 6 is a cross-sectional view illustrating a structure of a memory cell of the memory device of the present invention in Embodiment Mode 2.

Next, a structure which can be used for the memory cell of the memory device of this embodiment mode is described with reference to FIG. 6. FIG. 6 is a cross-sectional view illustrating the structure of the memory cell in this embodiment mode. Note that the case where a short-circuited type organic memory is used for a memory element of the memory cell is described in this embodiment mode.

As illustrated in FIG. 6, the memory cell in this embodiment mode is provided over a substrate 2000. The memory cell in this embodiment mode includes a transistor 2015, a third insulating layer 2010 which is provided over wirings 2008 and 2009 and has an opening portion, a first electrode 2011 which is provided so as to be in contact with part of the top surface of the wiring 2009 through the opening portion in the third insulating layer 2010, a fourth insulating layer 2012 which is provided over the first electrode 2011 and the third insulating layer 2010 and has an opening portion, an organic compound layer 2013 which is provided so as to be in contact with the top surface of the first electrode 2011 through the opening portion in the fourth insulating layer 2012, and a second electrode 2014 which is provided so as to be in contact with the top surface of the organic compound layer 2013. The transistor 2015 includes a semiconductor layer 2001 which has impurity regions 2004 and 2005, a gate insulating film 2002 provided over part of the semiconductor layer 2001, a gate electrode 2003 provided over part of the gate insulating film 2002, a first insulating layer 2006 which is provided over the gate electrode 2003 and the semiconductor layer 2001 and has an opening portion, a second insulating layer 2007 which is provided over the first insulating layer 2006 and has an opening portion, the wiring 2008 which is provided so as to be in contact with part of the top surface of the impurity region 2004 through the opening portion in the first insulating layer 2006, and the wiring 2009 which is provided so as to be in contact with part of the top surface of the impurity region 2005 through the opening portion in the second insulating layer 2007.

The first electrode 2011, the organic compound layer 2013, and the second electrode 2014 have a function as the memory element illustrated in FIG. 5.

As the transistor 2015, a thin film transistor (TFT), a field effect transistor (FET), or the like can be used, for example.

Instead of a glass substrate or a flexible substrate, a quartz substrate, a silicon substrate, a metal substrate, a stainless steel substrate, or the like can be used as the substrate 2000. A flexible substrate refers to a substrate which can be bent (is flexible). For example, a plastic substrate or the like formed using polycarbonate, polyalylate, polyethersulfone, or the like is an example of a flexible substrate. Alternatively, an attachment film (formed using polypropylene, polyester, vinyl, polyvinyl fluoride, polyvinyl chloride, or the like), paper of a fibrous material, a base material film (polyester, polyamide, an inorganic vapor deposition film, paper, or the like), or the like can be used.

Further, the memory cell array 200 can be provided over a field effect transistor formed over a semiconductor substrate such as a silicon substrate, or over a thin film transistor formed over a substrate such as a glass substrate.

In addition, as the substrate 2000, for example, any of the following substrates can be used: a single-crystal silicon substrate which has n-type or p-type conductivity, a compound semiconductor substrate (e.g., a GaAs substrate, an InP substrate, a GaN substrate, a SiC substrate, a sapphire substrate, or a ZnSe substrate), and an SOI (silicon on insulator) substrate which is manufactured using a bonding method or a SIMOX (separation by implanted oxygen) method. Alternatively, a glass substrate to which single-crystal silicon is attached can be used.

As each of the gate insulating film 2002, the first insulating layer 2006, the second insulating layer 2007, the third insulating layer 2010, and the fourth insulating layer 2012, one or a plurality of silicon oxide, silicon nitride, silicon oxynitride, or silicon nitride oxide can be used. Further, each of the gate insulating film 2002, the first insulating layer 2006, the second insulating layer 2007, the third insulating layer 2010, and the fourth insulating layer 2012 can have a stacked-layer structure by using the material/materials selected. The insulating layer can be formed by CVD, sputtering, or the like.

As the gate electrode 2003, tantalum, tungsten, titanium, molybdenum, aluminum, copper, chromium, niobium, or the like can be used. Alternatively, as well as a film formed of any of the above-described metals, the gate electrode 2003 can be formed using a film formed of an alloy which contains any of the above-described metals as its main component or a film formed using a compound which includes any of the above-described metals. Further alternatively, the gate electrode 2003 can be formed using a semiconductor such as polycrystalline silicon to which an impurity element which imparts conductivity to a semiconductor film, such as phosphorus, is added. Further, the gate electrode 2003 can be formed by being processed (patterned) into a predetermined shape.

The first electrode 2011, the second electrode 2014, and the organic compound layer 2013 which is provided between the first electrode 2011 and the second electrode 2014 have a function as the memory element 108 in FIG. 2.

As each of the first electrode 2011 and the second electrode 2014, an element, a compound, or the like which has high conductivity can be used. For example, an element selected from gold, silver, platinum, nickel, tungsten, chromium, molybdenum, iron, cobalt, copper, palladium, carbon, aluminum, manganese, titanium, tantalum, or the like, or a single-layer structure or a stacked-layer structure of an alloy which contains a plurality of the elements can be used. As an alloy which contains a plurality of the elements, for example, an alloy which contains Al and Ti, an alloy which contains Al, Ti, and C, an alloy which contains Al and Ni, an alloy which contains Al and C, an alloy which contains Al, Ni, and C, an alloy which contains Al and Mo, or the like can be used. Each of the first electrode 2011 and the second electrode 2014 can be formed using an evaporation method, sputtering, CVD, a printing method, or a droplet discharge method.

As the organic compound layer 2013, an organic resin typified by polyimide, acrylic, polyamide, benzocyclobutene, epoxy, or the like can be combined with an organic compound which has hole transporting properties or an organic compound which has electron transporting properties.

As an organic compound which has hole transporting properties, as well as phthalocyanine (abbr.: $H_2Pc$), copper phthalocyanine (CuPc), or vanadyl phthalocyanine (VoPc), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), 1,3,5-tris[N,N-di(m-tolyl)amino]benzene (abbr.: m-MTDAB), N,N'-diphenyl-N,N'-bis(3-methylphenyl)-1,1'-biphenyl-4,4'-diamine (abbr.: TPD), 4,4'-bis[N-(1-naphthyl)-N-phenylamino]biphenyl (abbr.: NPB), 4,4'-bis{N-[4-di-(m-tolyl)amino]phenyl-N-phenylamino}biphenyl (abbr.: DNTPD), 4,4'-bis[N-(4-biphenylyl)-N-phenylamino]biphenyl (abbr.: BBPB), 4,4',4"-tris(N-carbazolyl)tripheylamine (abbr.: TCTA), or the like can be used, for example. However, the present invention is not limited to this. The substances described here each mainly have a hole mobility equal to or greater than $10^{-6}$ cm$^2$/Vs.

As an organic compound which has electron transporting properties, a material formed using a metal complex or the like which has a quinoline skeleton or a benzoquinoline skeleton, such as tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr,: $BeBq_2$), or bis(2-methyl-8-quinolinolato)-4-phenylphenolato-aluminum (abbr.: BAlq) can be used. Alternatively, a material formed using a metal complex which has an oxazole ligand or a thiazole ligand, such as bis[2-(2-hydroxyphenyl)-benzoxazolato]zinc (abbr.: $Zn(BOX)_2$) or bis[2-(2-hydroxyphenyl)-benzothiazolato]zinc (abbr.: $Zn(BTZ)_2$) can be used. Further alternatively, instead of a metal complex, 2-(4-biphenylyl)-5-(4-tert-butylphenyl)-1,3,4-oxadiazole (abbr.: PBD), 1,3-bis[5-p-tert-butylphenyl)-1,3,4-oxadiazol-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproine (abbr.: BCP), or the like can be used. The substances described here each mainly have an electron mobility equal to or greater than $10^{-6}$ cm$^2$/Vs.

Note that a substance which has mobility in other range may be used. For example, 2,3-bis(4-diphenylaminophenyl)quinoxaline (abbr.: TPAQn), 9-[4-(N-carbazolyl)phenyl]-10-phenylanthracene (hereinafter referred to as CzPA), or the like may be used.

Alternatively, as the organic compound layer 2013, a plurality of the above-described organic compounds may be combined. Alternatively, the organic compound layer 2013 may be formed by stacking the above-described organic compounds.

Alternatively, as the organic compound layer 2013, an insulator may be mixed into an organic compound which has hole transporting properties or electron transporting properties. Note that it is not necessary that the insulator be uniformly dispersed. When the insulator is mixed, the morphology of the organic compound layer 2013 can be improved. Thus, partial crystallization or the like of a film can be suppressed. Therefore, variation in behavior of memory elements can be suppressed.

Further, it is preferable that the thickness of the organic compound layer 2013 be thickness where electric resistance of the memory element is changed by applying voltage to the first electrode 2011 and the second electrode 2014. Typical thickness of the organic compound layer 2013 is equal to or greater than 1 nm and equal to or less than 100 nm, preferably equal to or greater than 5 nm and equal to or less than 60 nm, more preferably equal to or greater than 5 nm and equal to or less than 30 nm.

Here, the writing principle of the memory element in this embodiment mode is described.

When the temperature of the substance of the organic compound layer 2013 rises to a glass transition point, the organic compound layer 2013 has fluxionality. Thus, when the temperature of the organic compound layer 2013 which includes an organic compound material rises to a glass transition point, the organic compound layer 2013 has fluxionality and does not have a constant form. When the organic compound layer 2013 has fluxionality, the form of the material of the organic compound layer 2013 in a solid state is not maintained and is changed over time. Thus, the organic compound layer 2013 is transformed, a region where the organic compound layer 2013 is not provided is formed between the first electrode 2011 and the second electrode 2014, and the first electrode 2011 and the second electrode 2014 are short-circuited in this region. When the first electrode 2011 and the second electrode 2014 are short-circuited, a resistance value in the memory element is decreased. Writing of data is performed by utilizing the principle where the resistance value of the memory element is changed.

Alternatively, a structure where an insulating layer is provided between the first electrode 2011 and the second electrode 2014 can be used. When the insulating layer is provided, expansion of the organic compound layer which has fluxionality can be controlled, so that the first electrode 2011 and the second electrode 2014 can be short-circuited more surely.

Next, operations of the memory device in this embodiment mode are described. Note that since specific operations of the reading circuit and the memory cell in this embodiment mode are the same as those of the reading circuit 103 and the memory cell 100 in Embodiment Mode 1, description thereof is partly omitted.

First, a writing operation is described. The memory cell 207 on which writing is performed is selected by the column decoder 202 and the row decoder 204. Specifically, a predetermined potential is supplied to the word line 205 which is connected to the memory cell 207 selected by the row decoder 204, and a potential which corresponds to data is supplied from the reading/writing circuit 201 to the second signal line 206 which is connected to the memory cell 207 selected by the column decoder 202 and the selector circuit 203. When a potential of the second signal line 206 is input to the memory element, the memory element is short-circuited and the selected memory cell 207 is set in a written state.

Note that the other word lines 205 and the other second signal lines 206 which are not selected are controlled so that data is not written to the other memory cells 207 which are connected to them. For example, when the second signal line 206 which is not selected is set in a floating state, miswriting of data can be prevented.

Since a data maintenance operation is similar to the data maintenance operation in Embodiment Mode 1, description thereof is omitted.

Next, a reading operation is described. The memory cell 207 from which data is to be read is selected by the column decoder 202 and the row decoder 204. Specifically, a predetermined potential is supplied to the word line 205 which is connected to the memory cell 207 selected by the row decoder 204. In addition, in the memory cell 207 selected by the column decoder 202 and the selector circuit 203, a potential which corresponds to written data is output to the second signal line 206 when the memory element is in a written state and a power supply potential VDD is output to the second signal line 206 when the memory element is in an unwritten state.

As described above, when the threshold voltage of the transistor is controlled by the reading circuit, the memory device in this embodiment mode can maintain a normal written state even when data holding characteristics of the memory element deteriorate over time.

Further, when a short-circuited type organic memory using an organic material is used for the memory element of the memory device in this embodiment mode, the memory device can be manufactured at low cost. Furthermore, when the material which is used is changed, characteristics of the memory element can be easily changed. Moreover, as well as a short-circuited type organic memory, various kinds of memories described in Embodiment Mode 1 can be used for the memory element of the memory device of the present invention.

Embodiment Mode 3

In this embodiment mode, a semiconductor device which has a memory device of the present invention is described.

A semiconductor device in this embodiment mode includes a memory circuit, stores information which is necessary for the memory circuit, and exchanges information with the outside by using contactless means, for example, wireless communication. With this feature, the semiconductor device in this embodiment mode has an application for an individual authentication system in which individual information of an object or the like is stored and the object is recognized by reading the information, for example. In order to use the semiconductor device in this embodiment mode for such an application, higher reliability is necessary because data on individual information is stored to recognize an object, for example.

Figure 7:
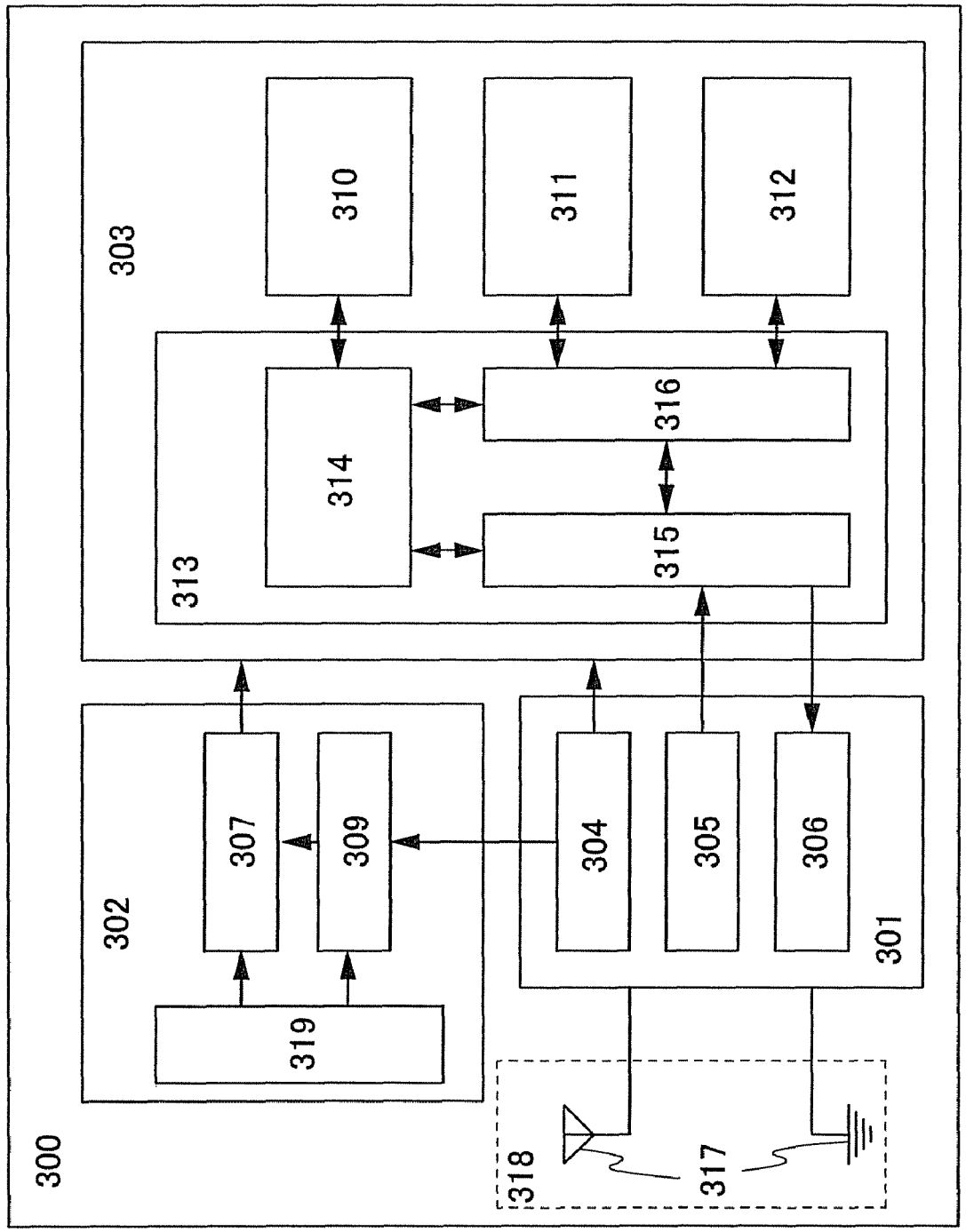
FIG. 7 is a block diagram illustrating a structure of a semiconductor device of the present invention in Embodiment Mode 3.

The structure of the semiconductor device in this embodiment mode is described with reference to FIG. 7. FIG. 7 is a block diagram illustrating the structure of the semiconductor device in this embodiment mode.

As illustrated in FIG. 7, a semiconductor device 300 includes a high frequency circuit 301, a clock generation circuit 302, a logic circuit 303, and an antenna 317 in an antenna portion 318. Note that although not illustrated in FIG. 7, the semiconductor device 300 transmits and receives wireless signals to and from an external circuit such as a wireless communication device through the antenna 317. Note that data transmission methods are roughly classified into the following three methods: an electromagnetic coupling method, in which a pair of coils is provided so as to be faced with each other and communicates with each other by mutual induction, an electromagnetic induction method, in which communication is performed using an induction field, and an electromagnetic wave method, in which communication is performed using an electromagnetic wave. Any of these methods can be used in this embodiment mode.

Next, the structure of each circuit is described. The high frequency circuit 301 includes a power supply circuit 304, a demodulation circuit 305, and a modulation circuit 306. In addition, the clock generation circuit 302 includes a frequency division circuit 307, a counter circuit 309, and a reference clock generation circuit 319. Further, the logic circuit 303 has a function of performing arithmetic processing, and includes a controller 313, a CPU (also referred to as a central processing unit) 310, a ROM (read only memory) 311, and a RAM (random access memory) 312.

In addition, the controller 313 includes a CPU interface 314, an RF interface 315, and a memory controller 316.

Further, in the high frequency circuit 301, the power supply circuit 304 includes a rectifier circuit and a storage capacitor, and has a function of generating power supply voltage from received signals and supplying the power supply voltage to other circuits. The demodulation circuit 305 includes a rectifier circuit and an LPF (low-pass filter) and has a function of extracting a command or data from communication signals. The modulation circuit 306 has a function of modulating transmission data, and modulated data is transmitted as a transmitted signal from the antenna 317.

Next, the operation of the semiconductor device in this embodiment mode is described. First, signals transmitted from an external communication device are received by the semiconductor device. The received signals which are input to the semiconductor device are demodulated by the demodulation circuit 305 and then input to the RF interface 315 in the controller 313. The received signals which are input to the RF interface 315 are subjected to arithmetic processing by the CPU 310 through the CPU interface 314. In addition, with the received signals which are input to the RF interface 315, access to the ROM 311 and the RAM 312 is performed through the memory controller 316.

Then, transmission data is generated after arithmetic processing is performed by the CPU 310 and data in the ROM 311 and the RAM 312 is input and output, the transmission data is modulated as a signal by the modulation circuit 306 and is transmitted from the antenna 317 to the external communication device.

In this embodiment mode, the memory device of the present invention can be mounted as the ROM 311 or the RAM 312 of the semiconductor device, or another memory circuit. When the memory device of the present invention is mounted, a highly reliable semiconductor device can be provided. Further, since the memory device of the present invention can be manufactured at low cost, manufacturing cost of the semiconductor device can be reduced.

Note that this embodiment mode can be combined with any of other embodiment modes as appropriate.

Embodiment Mode 4

In this embodiment mode, a method for manufacturing a semiconductor device which has a memory device of the present invention is described.

Figure 8A:
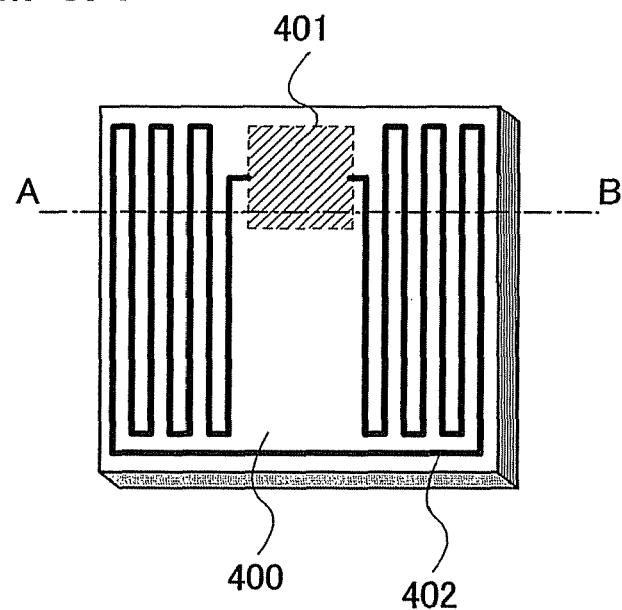
FIG. 8A is a schematic view illustrating a structure of a semiconductor device of the present invention in Embodiment Mode 4.

A semiconductor device of this embodiment mode is described with reference to FIGS. 8A and 8B. FIG. 8A is a schematic view illustrating the structure of the semiconductor device of this embodiment mode, and FIG. 8B is a cross-sectional view illustrating the structure of the semiconductor device of this embodiment mode.

As illustrated in FIG. 8A, the semiconductor device in this embodiment mode includes a substrate 400, an element portion 401 which is provided over the substrate 400, and an antenna 402 which is electrically connected to the element portion 401.

The element portion 401 includes a plurality of elements such as memory elements and has a function of processing signals received from the outside. The antenna 402 has a function of transmitting data in the semiconductor device.

Figure 8B:
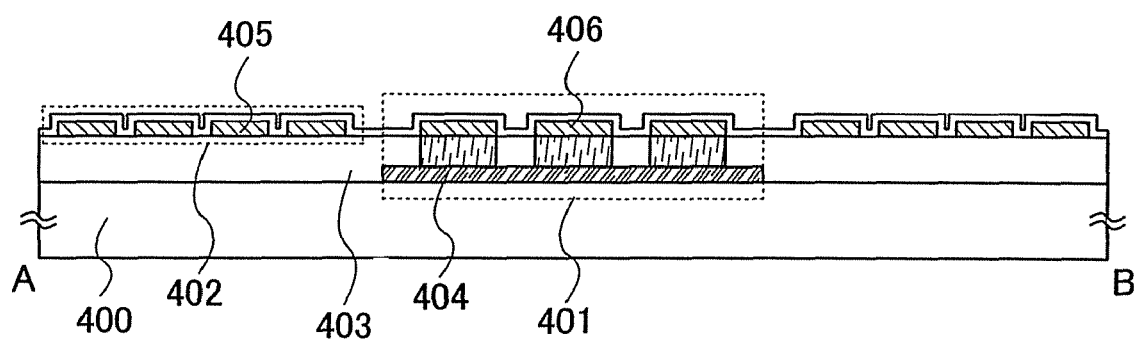
FIG. 8B is a cross-sectional view illustrating the structure of the semiconductor device of the present invention in Embodiment Mode 4.

Further, as illustrated in FIG. 8B, the semiconductor device in this embodiment mode includes an element 404 which is provided over the substrate 400, an interlayer film 403 which is provided over the element 404 and the substrate 400, a conductive layer 405 which is provided over the interlayer film 403 and functions as the antenna 402, a conductive layer 406 which is electrically connected to the element 404, and the element portion 401 which has the conductive layer 406 electrically connected to the element 404.

Note that although the conductive layer 405 which functions as the antenna 402 is provided in the same layer as the conductive layer 406 in the structure of FIG. 8B, the present invention is not limited to this. A structure can also be used in which, after the element portion 401 is provided, an insulating film is separately provided so as to cover the element portion and the conductive layer 405 is provided over the insulating film.

Figure 9A:
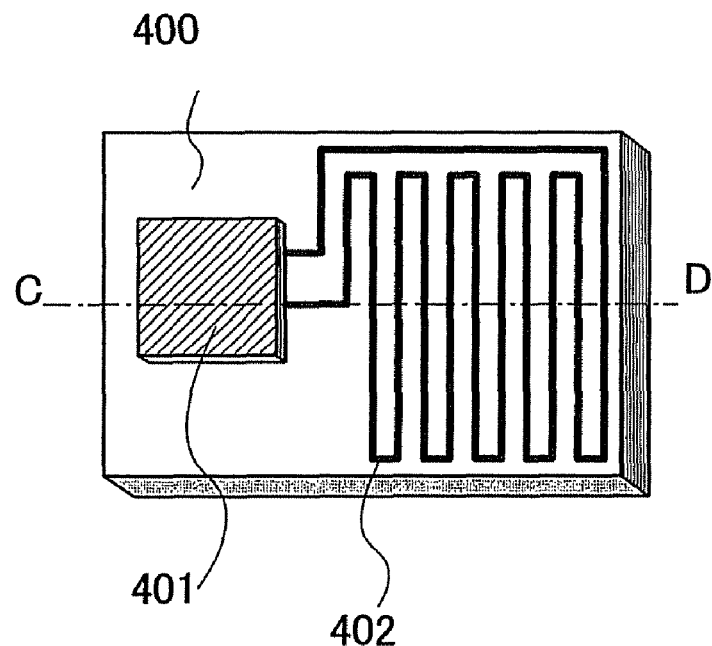
FIG. 9A is a schematic view illustrating a structure of the semiconductor device of the present invention in Embodiment Mode 4.

Furthermore, the semiconductor device of this embodiment mode is not limited to the structures of FIGS. 8A and 8B. Another structural example of the semiconductor device of this embodiment mode is described with reference to FIGS. 9A and 9B. FIG. 9A is a schematic view illustrating another structure of the semiconductor device of this embodiment mode, and FIG. 9B is a cross-sectional view illustrating the structure of the semiconductor device of this embodiment mode.

As illustrated in FIG. 9A, the semiconductor device in this embodiment mode includes the substrate 400, the element portion 401 which is provided over the substrate 400, and the antenna 402 which is electrically connected to the element portion 401.

In a manner similar to that of the structures of FIGS. 8A and 8B, the element portion 401 includes a plurality of elements such as memory elements and has a function of processing signals received from the outside. The antenna 402 has a function of transmitting data in the semiconductor device.

Figure 9B:
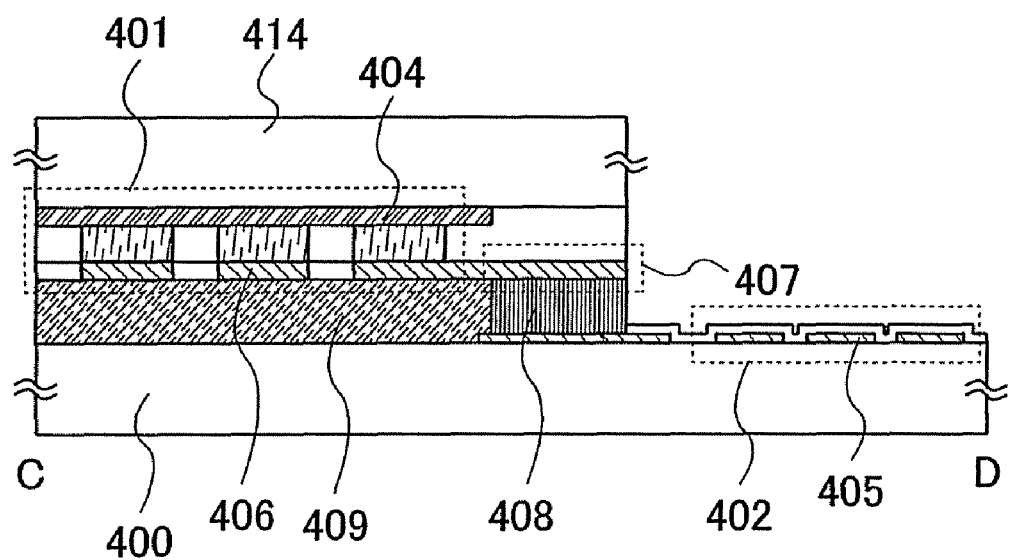
FIG. 9B is a cross-sectional view illustrating the structure of the semiconductor device of the present invention in Embodiment Mode 4.

Further, as illustrated in FIG. 9B, the semiconductor device in this embodiment mode includes the substrate 400, the conductive layer 405 which serves as the antenna 402 and a resin 409, which are provided over part of the substrate 400, a conductive particle layer 408 which is provided over the conductive layer 405, the conductive layer 406 which is provided over part of the resin 409 and the conductive particle 408, the element portion 401 which is provided over the conductive layer 406, and a substrate 414 which is provided over the element portion 401.

In the structure of FIGS. 9A and 9B, a terminal portion 406407 is provided and a conductive layer which is provided in the same layer as the conductive layer 406 is used as the terminal portion 407. In addition, the substrate 414 which is provided with the element portion 401 and the substrate 400 which is provided with the antenna 402 are attached so that the terminal portion 407 and the conductive particle layer 408 are electrically connected to each other.

In this embodiment mode, the memory device of the present invention can be used as a memory device in the element portion 401. When the memory device of the present invention is used, a semiconductor device having high reliability can be manufactured at low cost.

When a plurality of the element portions 401 are formed over a large substrate in advance and then cut into separate sections, the element portion 401 can be formed at low cost. As each of the substrate 400 and the substrate 414 used at this time, a glass substrate, a quartz substrate, a ceramic substrate, a metal substrate (e.g., a stainless steel substrate), a semiconductor substrate (e.g., a silicon substrate), or the like can be used. Alternatively, a flexible substrate formed using polyethylene terephthalate (PET), polyethylene naphthalate (PEN), polyether sulfone (PES), acrylic, or the like can be used as a plastic substrate.

A plurality of transistors, a memory device, and the like which are included in the element portion 401 are not limited to being provided in the same layer, and can be provided in a plurality of layers. When the element portion 401 is provided in a plurality of layers, an interlayer insulating film is used. As a material of the interlayer insulating film, a resin material such as an epoxy resin or an acrylic resin, a light-transmitting resin material such as a polyimide resin, a compound material which includes a siloxane material, such as a siloxane resin, a material which contains a water-soluble homopolymer and a water-soluble copolymer, or an inorganic material can be used. Further, a stacked-layer structure of plural kinds of the above-described materials can be used. A siloxane material corresponds to a material having a Si—O—Si bond. Siloxane has a skeleton structure of a bond of silicon (Si) and oxygen (O). As a substituent, an organic group which contains at least hydrogen (e.g., an alkyl group or aromatic hydrocarbon) is used. A fluoro group may be contained in the organic group. Note that the interlayer insulating film can be formed by CVD, sputtering, an SOG method, a droplet discharge method, a screen printing method, or the like.

Moreover, as a material of the interlayer insulating film, a material with low dielectric constant is preferably used for reducing parasitic capacitance which is generated between the layers. When the parasitic capacitance is reduced, high-speed operation and reduction in power consumption can be realized.

The conductive layer 405 and the conductive layer 406 can be formed by using CVD, sputtering, a printing method such as a screen printing, a printing method such as a screen printing method or a gravure printing method, a droplet discharge method, a dispenser method, a plating method, or the like. The conductive layer 405 and the conductive layer 406 can be formed with a single-layer structure or a stacked-layer structure of an element selected from aluminum, titanium, silver, copper, gold, platinum, nickel, palladium, tantalum, or molybdenum, or an alloy material or compound material which contains any of these elements as its main component.

For example, in the case of forming the conductive layer 405 and the conductive layer 406 by using a screen printing method, the conductive layer 405 and the conductive layer 406 can be formed by selectively printing a conductive paste where a conductive particle having a particle size of several nm to several tens μm is dissolved or dispersed in an organic resin. As the conductive particle, metal particles of one or more of silver, gold, copper, nickel, platinum, palladium, tantalum, molybdenum, titanium, and the like, a fine particle of silver halide, or a dispersing nano particle can be used. In addition, as the organic resin included in the conductive paste, one or more of organic resins selected from organic resins which function as a binder, a solvent, a dispersive agent, and a coating member of the metal particles can be used. Typically, an organic resin such as an epoxy resin or a silicone resin can be used. Further, in forming the conductive layer, baking is preferably performed after the conductive paste is pushed out. For example, in the case of using a fine particle which includes silver as its main component (e.g., a particle size is equal to or greater than 1 nm and equal to or less than 100 nm) as a material for the conductive paste, the conductive layer can be obtained by baking it with temperatures in the range of 150 to 300° C. to cure. Alternatively, a fine particle which includes solder or lead-free solder as its main component may be used as a fine particle. In this case, it is preferable that a fine particle having a particle size of 20 μm or less be used. When solder or lead-free solder is used, the conductive layer 405 and the conductive layer 406 can be formed at low cost.

When the integrated circuit or the like is provided over the element portion 401, for example, a transistor which includes an active layer formed of a single-layer structure or a stacked layer structure of any of an amorphous semiconductor, a microcrystalline semiconductor (also referred to as a microcrystal semiconductor), a polycrystalline semiconductor, an organic semiconductor, and the like can be used as each of the transistors included in the element portion. In order to obtain a transistor with favorable characteristics, an active layer which is crystallized by using a metal element as a catalyst or an active layer which is crystallized by laser irradiation is preferably used. Alternatively, as an active layer, a semiconductor layer which is formed by plasma CVD by using an $SiH_4/F_2$ gas or an $SiH_4/H_2$ gas (an Ar gas), or a semiconductor layer which is irradiated with a laser can be used.

Further, each of the transistors included in the element portion 401 can be formed using a crystalline semiconductor layer (a low temperature polysilicon layer) which is obtained by crystallizing an amorphous semiconductor layer at a temperature equal to or higher than 200° C. and equal to or lower than 600° C. (preferably equal to or higher than 350° C. and equal to or lower than 500° C.) or a crystalline semiconductor layer (a high temperature polysilicon layer) which is obtained by crystallizing an amorphous semiconductor layer at a temperature equal to or higher than 600° C. Note that when a high temperature polysilicon layer is formed over a substrate, a quartz substrate is preferably used because a glass substrate is weak to heat in some cases.

Hydrogen or a halogen element is preferably added to the active layers (particularly channel regions) of the transistors included in the element portion 401 at a concentration equal to or higher than $1 \times 10^{19}$ atoms/cm$^3$ and equal to or lower than $1 \times 10^{22}$ atoms/cm$^3$, more preferably a concentration of equal to or higher than $1 \times 10^{19}$ atoms/cm$^3$ and equal to or lower than $5 \times 10^{20}$ atoms/cm$^3$. Thus, active layers with few defects, in which cracks are not easily generated, can be obtained.

Further, it is preferable to provide a barrier film which blocks contaminant such as an alkali metal so as to wrap the transistors included in the element portion 401 or the element portion 401 itself. Thus, the element portion 401, which is not contaminated and has higher reliability, can be provided. Note that a silicon nitride film, a silicon nitride oxide film, a silicon oxynitride film, or the like can be used as the barrier film. Further, the thickness of each of the active layers of the transistors included in the element portion 401 is 20 to 200 nm, preferably 40 to 170 nm, more preferably 45 to 55 nm or 145 to 155 nm, and still more preferably 50 nm or 150 nm. Thus, the element portion 401, in which cracks are not easily generated even in the case of being bent, can be provided.

Further, it is preferable that crystals which are included in the active layers of the transistors included in the element portion 401 be formed so as to have a crystal boundary extending in parallel to a direction where carries flow (a channel length direction). Such an active layer is formed using a continuous wave laser, or a pulsed laser which is operated at a frequency equal to or higher than 10 MHz, preferably equal to or higher than 60 MHz and equal to or lower than 100 MHz.

Furthermore, it is preferable that each of the transistors included in the element portion 401 have characteristics of a subthreshold swing equal to or less than 0.35 V/dec (preferably equal to or greater than 0.09 V/dec and equal to or less than 0.25 V/dec), and a mobility equal to or greater than 10 cm$^2$/Vs. Such characteristics can be realized when each of the active layers is formed by using a continuous wave laser or a pulsed laser which is operated at a frequency equal to or higher than 10 MHz.

Moreover, each of the transistors included in the element portion 401 has frequency characteristics equal to or higher than 1 MHz, preferably equal to or higher than 10 MHz (at 3 to 5 V) at the ring oscillator level. Alternatively, each of the transistors included in the element portion 401 has frequency characteristics equal to or higher than 100 kHz, preferably equal to or higher than 1 MHz (at 3 to 5 V) per gate.

Figure 10A:
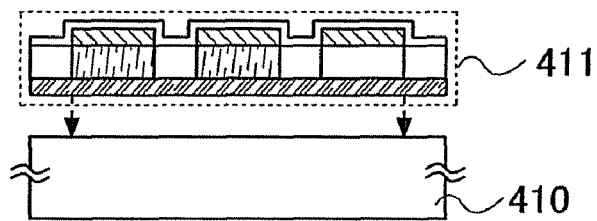
FIGS. 10A and 10B are cross-sectional views each illustrating a method for manufacturing the semiconductor device of the present invention in Embodiment Mode 4.
Figure 10B:
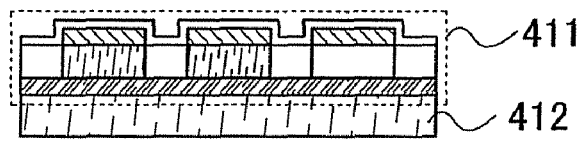

The substrate over which the element portion is formed can be used directly, the present invention is not limited to this. FIGS. 10A and 10B show an example where a substrate which is different from the substrate over which the element portion is formed is used. FIGS. 10A and 10B are schematic views illustrating another structure and another method for manufacturing the semiconductor device in this embodiment mode.

As illustrated in FIG. 10A, in a substrate 410 over which an element portion 411 is formed, the element portion 411 over the substrate 410 is separated. Further, as illustrated in FIG. 10B, the separated element portion 411 can be attached to a substrate 412, which is different from the substrate 410. Note that as the substrate 412, a flexible substrate or the like can be used, for example.

The element portion 411 can be separated from the substrate 410 by any of the following methods: a method in which a metal oxide film is provided between the substrate 410 of high heat resistance and the element portion 411 and the metal oxide film is crystallized to be weakened so that the element portion 411 is separated; a method in which an amorphous silicon film containing hydrogen is provided between the substrate 410 of high heat resistance and the element portion 411 and the amorphous silicon film is removed by laser light irradiation or etching so that the element portion 411 is separated; a method in which the substrate 410 of high heat resistance, over which the element portion 411 is formed, is removed mechanically or by etching with a solution or a gas such as CF$_3$ so that the element portion 411 is separated; and the like.

Alternatively, instead of the above-described methods, a metal film (formed using tungsten, molybdenum, titanium, tantalum, or cobalt, for example) which functions as a separation layer, or a metal oxide film (formed using tungsten oxide, molybdenum oxide, titanium oxide, tantalum oxide, cobalt oxide, a stacked-layer structure of a metal film and a metal oxide film, for example) is provided between the substrate 410 and the element portion 411, and the element portion 411 can be separated from the substrate 410 by using physical means. Alternatively, after an opening portion is formed as selected to expose the separation layer, part of the separation layer is removed with an etching agent such as halogen fluoride (e.g., ClF$_3$), and then, the element portion 411 can be separated from the substrate 410 physically.

Further, the separated element portion 411 may be attached to the substrate 412 by using a commercialized adhesive, for example, an adhesive such as an epoxy resin-based adhesive or a resin additive.

Figure 10C:
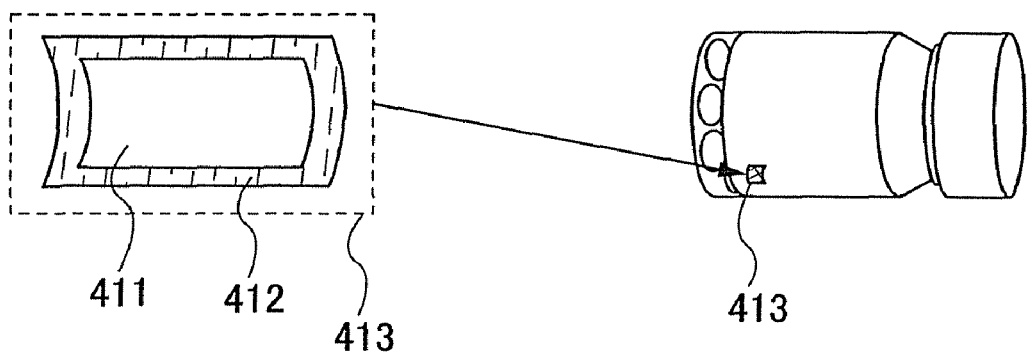
FIG. 10C is a schematic view illustrating a method for manufacturing the semiconductor device of the present invention in Embodiment Mode 4.

When the element portion 411 is attached to the substrate 412 so that the semiconductor device is manufactured as described above, a semiconductor device which is thin, lightweight, and is not easily broken even when it is dropped can be provided. Further, since a flexible substrate is used as the substrate 412, the substrate 412 can be attached to a curved surface or an irregular shape and various applications are realized. For example, as illustrated in FIG. 10C, a semiconductor device 413 of the present invention can be tightly attached to a curved surface of a medicine bottle, for example. Moreover, when the substrate 410 is reused, a semiconductor device can be provided at lower cost.

Note that this embodiment mode can be combined with any of other embodiment modes as appropriate.

Embodiment Mode 5

In this embodiment mode, the case where a flexible semiconductor device is manufactured by using a separation process is described.

Figure 11A:
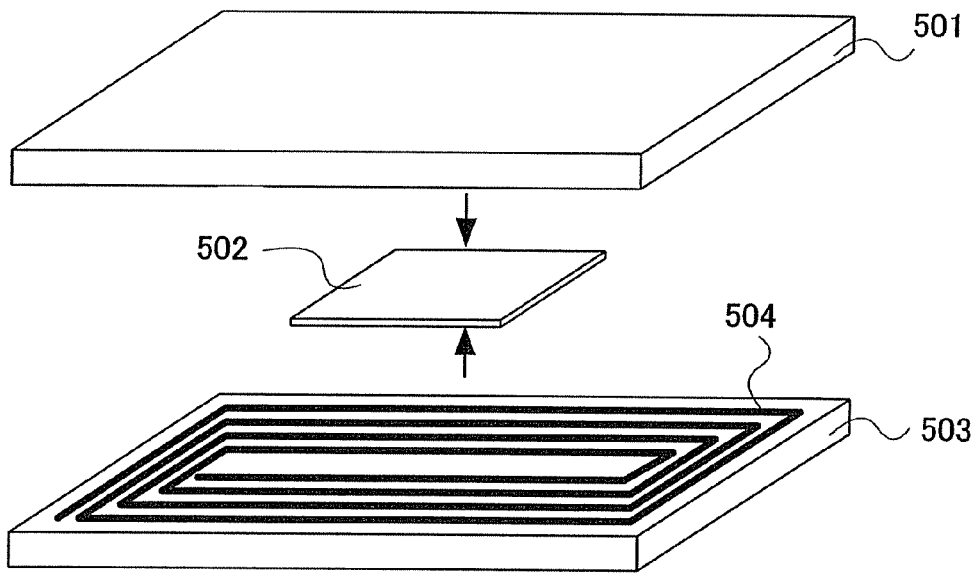
FIG. 11A is a schematic view illustrating a method for manufacturing a semiconductor device of the present invention in Embodiment Mode 5.
Figure 11B:
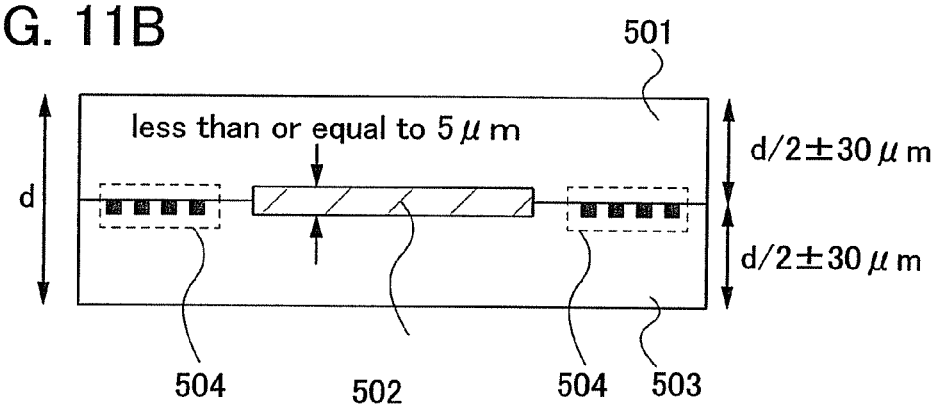
FIG. 11B is a cross-sectional view illustrating the method for manufacturing the semiconductor device of the present invention in Embodiment Mode 5.
Figure 11C:
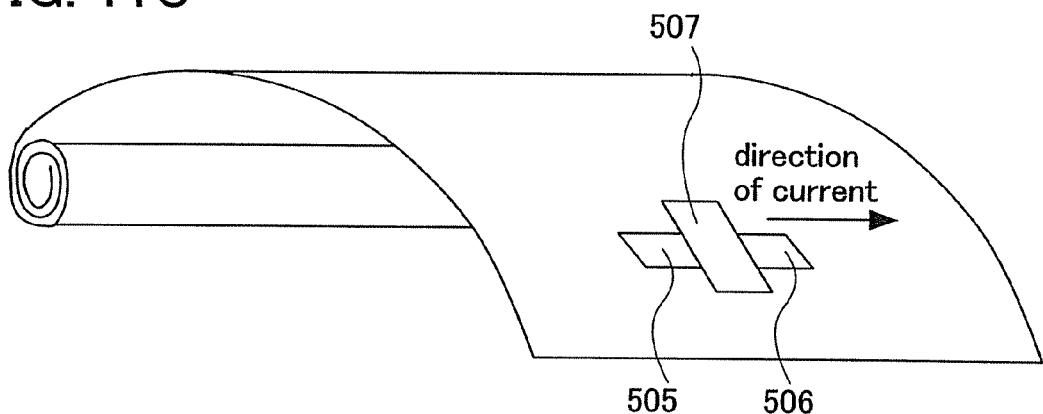
FIG. 11C is a schematic view illustrating a method for manufacturing the semiconductor device of the present invention in Embodiment Mode 5.

A method for manufacturing a semiconductor device in this embodiment mode is described with reference to FIGS. 11A to 11C. FIGS. 11A to 11C are top views illustrating the structure of the semiconductor device in this embodiment mode.

As illustrated in FIG. 11A, the semiconductor device in this embodiment mode includes a flexible protective layer 501, a flexible protective layer 503 having an antenna 504, and an element portion 502 which is formed through a separation process. The antenna 504 which is formed over the protective layer 503 is electrically connected to the element portion 502. Although the antenna 504 is formed only over the protective layer 503 in FIG. 11A, the present invention is not limited to this structure. The antenna 504 can also be provided for the protective layer 501. In addition, when a barrier film formed of a silicon nitride film or the like is formed between the element portion 502, and the protective layers 501 and 503, a semiconductor device having higher reliability can be provided, without contamination of the element portion 502.

For a conductive layer which functions as the antenna 504, any of the materials described in Embodiment Mode 4 can be used. Note that although the element portion 502 and the antenna 504 are connected to each other by UV treatment or ultrasonic cleaning with an anisotropic conductive film, the present invention is not limited to this method. The element portion 502 and the antenna 504 can be connected to each other by various methods.

As illustrated in FIG. 11B, the thickness of the element portion 502 which is interposed between the protective layers 501 and 503 is preferably equal to or less than 5 μm, more preferably greater than or equal to 0.1 μm and less than or equal to 3 μm. In addition, when the thickness of the protective layers 501 and 503 which are superposed is denoted by d, the thickness of the protective layers 501 and 503 is preferably (d/2)±30 μm, more preferably (d/2)±10 μm. Further, the thickness of the protective layers 501 and 503 is preferably greater than or equal to 10 μm and less than or equal to 200 μm. Furthermore, the area of the element portion 502 is equal to or less than 5 mm×5 mm (25 mm$^2$), preferably equal to or greater than 0.3 mm×0.3 mm (0.09 mm$^2$) and less than or equal to 4 mm×4 mm (16 mm$^2$).

Since the protective layers 501 and 503 are formed using an organic resin material, the protective layers 501 and 503 has high resistance against bending. Further, the element portion 502 itself which is formed through the separation process has higher resistance against bending than a single-crystal semiconductor. Since the element portion 502 can be tightly attached to the protective layers 501 and 503 without any space therebetween, the completed semiconductor device itself has high resistance against bending. The element portion 502 which is surrounded by the protective layers 501 and 503 may be provided over a surface of or inside another object, or may be embedded in paper.

Next, the case where the element portion which is formed through the separation process is attached to a substrate having a curved surface is described.

As illustrated in FIG. 11C, one transistor which is selected from the element portion formed through the separation process is linear in a direction where current flows. That is, a drain electrode 505, a gate electrode 507, and a source electrode 506 are located linearly. In addition, the direction where current flows and a direction where a substrate draws an arc are arranged to be perpendicular to each other. With such arrangement, even when the substrate is bent to draw an arc, the influence of stress is small, and variation in characteristics of transistors included in the element portion can be suppressed.

Further, when the ratio of the area of an active region (a silicon island portion) of an active element such as a transistor to the whole area of the substrate is 1 to 50% (preferably 1 to 30%), damage of the element due to stress can be prevented.

In a region where an active element is not provided, a base insulating material, an interlayer insulating film material, and a wiring material are mainly provided. The ratio of the area of other than the active region such as a transistor to the whole area of the substrate is preferably equal to or higher than 60%. Thus, a semiconductor device which can be easily bent and has a high integration degree can be provided.

When a semiconductor device which has a memory device of the present invention is manufactured using the method for manufacturing the semiconductor device in this embodiment mode as described above, the semiconductor device can be manufactured even over a curved surface and the application range of the semiconductor device can be made wider.

Note that this embodiment mode can be combined with any of other embodiment modes as appropriate.

Embodiment Mode 6

In this embodiment mode, usage examples of a semiconductor device which has any of the memory devices of the aforementioned embodiment modes are described.

Usage examples of a semiconductor device which has any of the semiconductor devices of the aforementioned embodiment modes are described with reference to FIGS. 12A to 12F. FIGS. 12A to 12F are schematic views illustrating usage examples of a semiconductor device of the present invention.

Figure 12A:
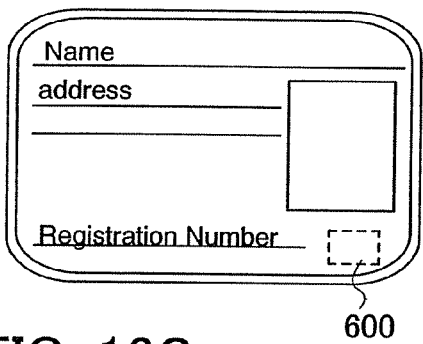
FIGS. 12A to 12F are schematic views illustrating usage examples of a semiconductor device of the present invention in Embodiment Mode 6.
Figure 12B:
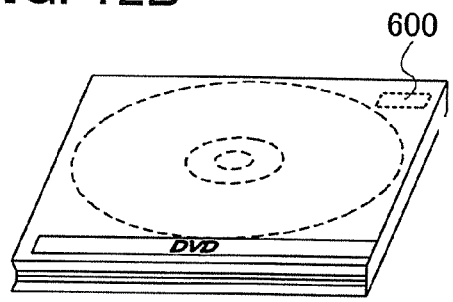
Figure 12C:
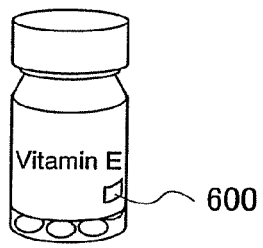
Figure 12D:
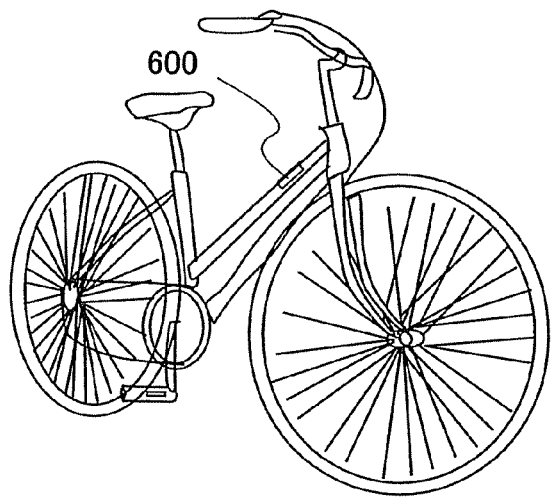
Figure 12E:
Figure 12F:
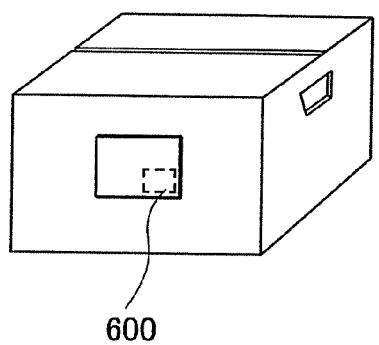

As illustrated in FIGS. 12A to 12F, the semiconductor device can be used widely and can be used by being provided for, for example, bills, coins, securities, bearer bonds, certificates (e.g., driver's licenses or resident cards, see FIG. 12A), or objects such as containers for wrapping (e.g., wrapping paper or bottles, see FIG. 12C), recording media (e.g., DVDs or video tapes, see FIG. 12B), vehicles (e.g., bicycles, see FIG. 12D), personal belongings (e.g., bags or glasses), foods, plants, animals, clothes, livingwares, or electronic devices (e.g., liquid crystal display devices, EL display devices, television sets, or mobile phones), or shipping tags of the objects (see FIGS. 12E and 12F).

A semiconductor device 600 of the present invention is fixed to an object by being mounted on a printed board, attached to a surface, or embedded therein. For example, the semiconductor device is fixed to an object by being embedded in a paper of a book or an organic resin of a package. Since the semiconductor device 600 of the present invention achieves reduction in size, thickness, and weight, an attractive design of the object itself is not spoiled even after the semiconductor device 600 of the present invention is fixed to the object. In addition, when the semiconductor device 600 of the present invention is provided for bills, coins, securities, bearer bonds, certificates, or the like, a certification function can be provided, and forgery thereof can be prevented by utilizing the certification function. Further, when the semiconductor device of the present invention is attached to containers for wrapping, recording media, personal belongings, foods, clothes, livingwares, electronic devices, or the like, a system such as an inspection system can be efficiently used. Furthermore, when the semiconductor device of the present invention is attached to vehicles, safety against theft or the like can be increased.

When a semiconductor device which has the memory device of the present invention is used for each usage described in this embodiment mode in this manner, data which is used for exchanging information can be maintained at an accurate value. Therefore, authenticity or security of an object can be increased.

Note that this embodiment mode can be combined with any of other embodiment modes as appropriate.

EXAMPLE 1

In this example, calculation results of change in threshold resistance in the case where a reading transistor of a memory device of the present invention is controlled so that the threshold voltage thereof has a predetermined value by simulation are described.

Figure 13:
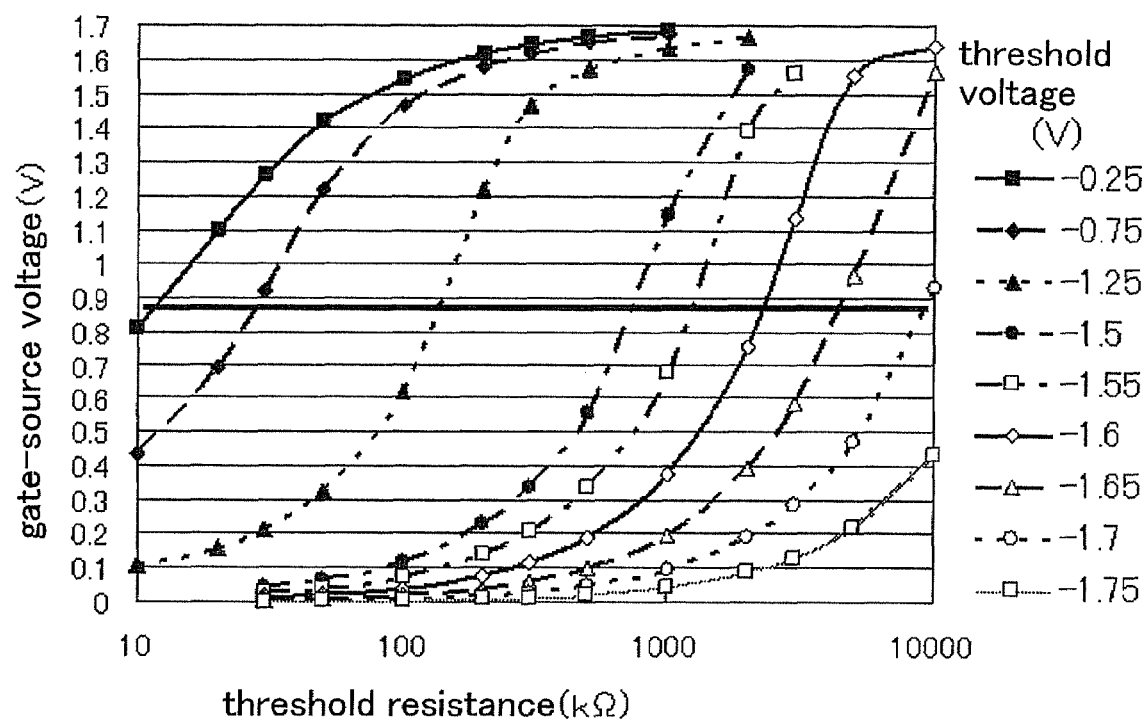
FIG. 13 is a diagram illustrating a relationship between the threshold voltage and the threshold resistance of a transistor in Example 1.
Figure 14:
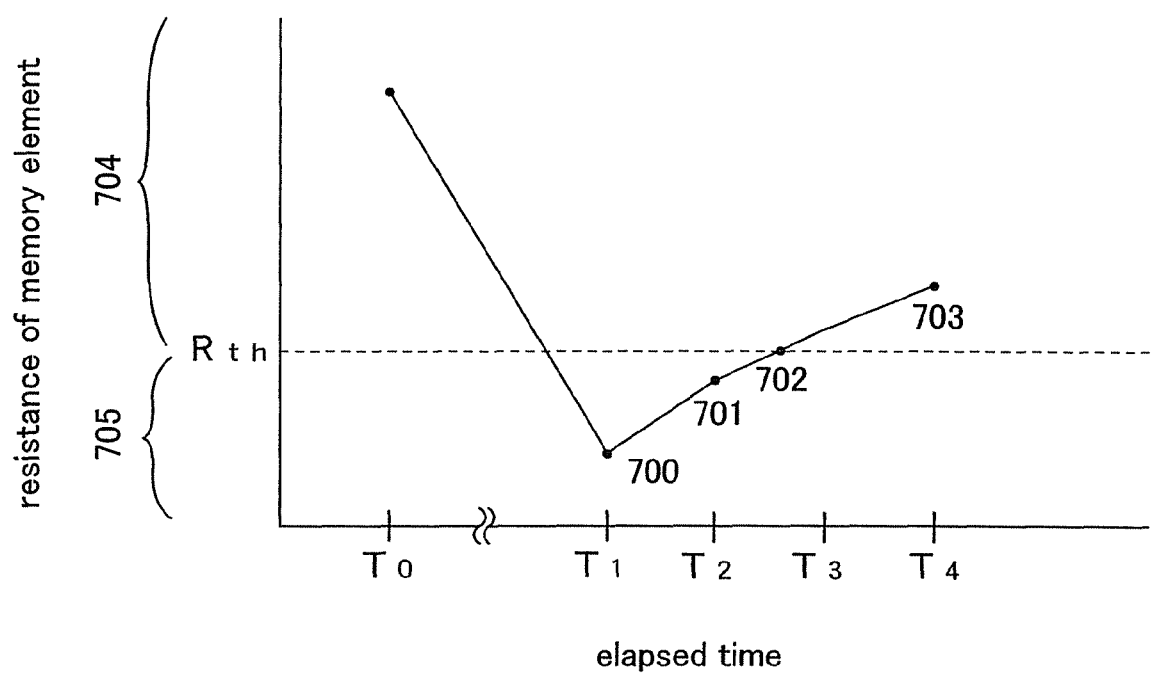
FIG. 14 is a diagram illustrating change in resistance values of a memory element over time in a conventional example.

Calculation results of change in threshold resistance by change in the threshold voltage of the memory device in this example are illustrated in FIG. 13. FIG. 13 illustrates a relationship between the threshold voltage and the threshold resistance of the memory device of this example. Note that a transistor in a reading circuit of this example is a p-channel transistor. The gate width of the transistor is 8 μm and the gate length of the transistor is 10 μm.

From the results in FIG. 13, it can be seen that the threshold resistance is about 30 kΩ when the threshold voltage is −0.75 V while the threshold resistance is about 2 MΩ when the threshold voltage is changed to −1.6 V, and that even a high resistance value of 2 MΩ is recognized as a written state.

As described above, according to the calculation results, when the threshold voltage of the reading transistor is shifted in a direction where the absolute value thereof is increased, threshold resistance for determining whether the state is a written state or an unwritten state is also increased. Since the threshold resistance $R_{th}$ in a written state or an unwritten state should be set between the maximum value $R_{max}$ of resistance which is changed over time and the initial value $R_0$ of the resistance in an unwritten state as described above, when the maximum value of the resistance which is changed over time is 1 MΩ and the initial value $R_0$ of the resistance in the unwritten state is 5 MΩ, the threshold voltage of the p-channel transistor is preferably in the range of −1.65 V to −1.55.

This application is based on Japanese Patent Application serial no. 2007-227386 filed with Japan Patent Office on Sep. 3, 2007, the entire contents of which are hereby incorporated by reference.

What is claimed is:

1. A memory device comprising:
a power supply line;
a first signal line;
a second signal line;
an output terminal;
a reading circuit including a transistor and a clocked inverter; and
a memory cell including a memory element, the memory cell being electrically connected to the second signal line and the reading circuit,
wherein an input terminal of the clocked inverter is electrically connected to the second signal line,
wherein an output terminal of the clocked inverter is electrically connected to the output terminal,
wherein the transistor comprises:
a first terminal electrically connected to the power supply line and serving as one of a source terminal and a drain terminal;
a second terminal electrically connected to the memory cell through the second signal line and serving as the other of the source terminal and the drain terminal;
a third terminal electrically connected to the first signal line and serving as a gate terminal; and
a fourth terminal,
wherein the reading circuit comprises an inverter, wherein an input terminal of the inverter is electrically connected to the first signal line, and
wherein an output terminal of the inverter is electrically connected to the third terminal of the transistor.

2. The memory device according to claim 1, wherein the transistor is turned ON by supplying a first potential to a channel region of the transistor through the third terminal and threshold voltage of the transistor is controlled by supplying a second potential to the channel region through the fourth terminal.

3. The memory device according to claim 1, wherein the memory element includes a first electrode, a second electrode, and an organic compound layer between the first and second electrodes.

4. A memory device comprising:
a power supply line;
a first signal line;
a second signal line;
an output terminal;
a reading circuit including a transistor and a clocked inverter; and
a memory cell including a memory element, and the memory cell being electrically connected to the second signal line and the reading circuit,
wherein the reading circuit is electrically connected to the power supply line, the first signal line, the second signal line,
wherein an input terminal of the clocked inverter is electrically connected to the second signal line,
wherein an output terminal of the clocked inverter is electrically connected to the output terminal,
wherein the transistor comprises:
a first gate electrode;
a second gate electrode;
a semiconductor layer between the first and second gate electrodes, the semiconductor layer including a source region, a drain region, and a channel region between the source and drain regions;
a first gate insulating film between the first gate electrode and the semiconductor layer; and
a second gate insulating film between the second gate electrode and the semiconductor layer,
wherein the reading circuit comprises an inverter, wherein an input terminal of the inverter is electrically connected to the first signal line, and
wherein an output terminal of the inverter is electrically connected to the first gate electrode of the transistor.

5. The memory device according to claim 4, wherein the transistor is turned ON by supplying a first potential to the channel region through the first gate electrode and threshold voltage of the transistor is controlled by supplying a second potential to the channel region through the second gate electrode.

6. The memory device according to claim 4, wherein the memory element includes a first electrode, a second electrode, and an organic compound layer between the first and second electrodes.

7. A memory device comprising:
a power supply line;
a first signal line;
a second signal line;
an output terminal;
a reading circuit including a transistor and a clocked inverter; and
a memory cell including a memory element, and the memory cell being electrically connected to the second signal line and the reading circuit,
wherein the reading circuit is electrically connected to the power supply line, the first signal line, the second signal line,
wherein an input terminal of the clocked inverter is electrically connected to the second signal line,
wherein an output terminal of the clocked inverter is electrically connected to the output terminal,
wherein the transistor comprises:
a semiconductor substrate including a first impurity region serving as one of a source region and a drain region, a second impurity region serving as the other of the source region and the drain region, a channel region between the first and second impurity regions, and a third impurity region; and
a gate electrode over the channel region with a gate insulating film interposed therebetween,
wherein the reading circuit comprises an inverter, wherein an input terminal of the inverter is electrically connected to the first signal line, and
wherein an output terminal of the inverter is electrically connected to the gate electrode of the transistor.

8. The memory device according to claim 7, wherein the transistor is turned ON by supplying a first potential to the channel region through the gate electrode and threshold voltage of the transistor is controlled by supplying a second potential to the channel region through the third impurity region.

9. The memory device according to claim 7, wherein the memory element includes a first electrode, a second electrode, and an organic compound layer between the first and second electrodes.

10. A semiconductor device comprising:
an antenna;
a high frequency circuit electrically connected to the antenna; and
a logic circuit comprising a memory device, electrically connected to the high frequency circuit,
the memory device comprising:
a power supply line;
a first signal line;
a second signal line;
an output terminal;
a reading circuit including a transistor and a clocked inverter; and
a memory cell including a memory element, the memory cell being electrically connected to the second signal line and the reading circuit,
wherein an input terminal of the clocked inverter is electrically connected to the second signal line,
wherein an output terminal of the clocked inverter is electrically connected to the output terminal,
wherein the transistor comprises:
a first terminal electrically connected to the power supply line and serving as one of a source terminal and a drain terminal;
a second terminal electrically connected to the memory cell through the second signal line and serving as the other of the source terminal and the drain terminal;
a third terminal electrically connected to the first signal line and serving as a gate terminal; and
a fourth terminal,
wherein the reading circuit comprises an inverter, wherein an input terminal of the inverter is electrically connected to the first signal line, and
wherein an output terminal of the inverter is electrically connected to the third terminal of the transistor.

11. The memory device according to claim 10, wherein the transistor is turned ON by supplying a first potential to a channel region of the transistor through the third terminal and threshold voltage of the transistor is controlled and by supplying a second potential to the channel region through the fourth terminal.

12. The memory device according to claim 10, wherein the memory element includes a first electrode, a second electrode, and an organic compound layer between the first and second electrodes.

13. The semiconductor device according to claim 10, wherein the semiconductor device is incorporated into an electronic device selected from the group consisting of a liquid crystal display devices, an EL display devices, a television set, and a mobile phone.

14. A semiconductor device comprising:
an antenna;
a high frequency circuit electrically connected to the antenna; and
a logic circuit comprising a memory device, electrically connected to the high frequency circuit,
the memory device comprising:
a power supply line;
a first signal line;
a second signal line;
an output terminal;
a reading circuit including a transistor and a clocked inverter; and
a memory cell including a memory element, the memory cell being electrically connected to the second signal line and the reading circuit,
wherein the reading circuit is electrically connected to the power supply line, the first signal line, the second signal line,
wherein an input terminal of the clocked inverter is electrically connected to the second signal line,
wherein an output terminal of the clocked inverter is electrically connected to the output terminal,
wherein the transistor comprises:
a first gate electrode;
a second gate electrode;
a semiconductor layer between the first and second gate electrodes, the semiconductor layer including a source region, a drain region, and a channel region between the source and drain regions;
a first gate insulating film between the first gate electrode and the semiconductor layer; and
a second gate insulating film between the second gate electrode and the semiconductor layer,
wherein the reading circuit comprises an inverter, wherein an input terminal of the inverter is electrically connected to the first signal line, and
wherein an output terminal of the inverter is electrically connected to the first gate electrode of the transistor.

15. The memory device according to claim 14, wherein the transistor is turned ON by supplying a first potential to the channel region through the first gate electrode and threshold voltage of the transistor is controlled by supplying a second potential to the channel region through the second gate electrode.

16. The memory device according to claim 14, wherein the memory element includes a first electrode, a second electrode, and an organic compound layer between the first and second electrodes.

17. The semiconductor device according to claim 14, wherein the semiconductor device is incorporated into an electronic device selected from the group consisting of a liquid crystal display devices, an EL display devices, a television set, and a mobile phone.

18. A semiconductor device comprising:
an antenna;
a high frequency circuit electrically connected to the antenna; and
a logic circuit comprising a memory device, electrically connected to the high frequency circuit,
the memory device comprising:
a power supply line;
a first signal line;
a second signal line;
an output terminal;
a reading circuit including a transistor and a clocked inverter; and
a memory cell including a memory element, the memory cell being electrically connected to the second signal line and the reading circuit,
wherein the reading circuit is electrically connected to the power supply line, the first signal line, the second signal line,
wherein an input terminal of the clocked inverter is electrically connected to the second signal line,
wherein an output terminal of the clocked inverter is electrically connected to the output terminal,
wherein the transistor comprises:
a semiconductor substrate including a first impurity region serving as one of a source region and a drain region, a second impurity region serving as the other of the source region and the drain region, a channel region between the first and second impurity regions, and a third impurity region; and a gate electrode over the channel region with a gate insulating film interposed therebetween, wherein the reading circuit comprises an inverter, wherein an input terminal of the inverter is electrically connected to the first signal line, and wherein an output terminal of the inverter is electrically connected to the gate electrode of the transistor.

19. The memory device according to claim 18, wherein the transistor is turned ON by supplying a first potential to the channel region through the gate electrode and threshold voltage of the transistor is controlled by supplying a second potential to the channel region through the third impurity region.

20. The memory device according to claim 18, wherein the memory element includes a first electrode, a second electrode, and an organic compound layer between the first and second electrodes.

21. The semiconductor device according to claim 18, wherein the semiconductor device is incorporated into an electronic device selected from the group consisting of a liquid crystal display devices, an EL display devices, a television set, and a mobile phone.

* * * * *